(12) United States Patent
Pregl et al.

(10) Patent No.: US 10,843,915 B2
(45) Date of Patent: *Nov. 24, 2020

(54) FORMING AN OFFSET IN AN INTERDIGITATED CAPACITOR OF A MICROELECTROMECHANICAL SYSTEMS (MEMS) DEVICE

(71) Applicant: Infineon Dresden GmbH & Co. KG, Dresden (DE)

(72) Inventors: Sebastian Pregl, Dresden (DE); Uwe Rudolph, Dresden (DE)

(73) Assignee: Infineon Dresdon GmbH & Co. KG, Dresdon (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/382,750

(22) Filed: Apr. 12, 2019

(65) Prior Publication Data

US 2019/0233276 A1    Aug. 1, 2019

Related U.S. Application Data

(62) Division of application No. 15/664,834, filed on Jul. 31, 2017, now Pat. No. 10,266,389.

(51) Int. Cl.
*B81B 3/00* (2006.01)
*B81C 1/00* (2006.01)

(52) U.S. Cl.
CPC .......... *B81B 3/0051* (2013.01); *B81B 3/0086* (2013.01); *B81C 1/00166* (2013.01); *B81C 1/00182* (2013.01); *B81B 2201/0221* (2013.01); *B81B 2201/0257* (2013.01); *B81B 2201/042* (2013.01); *B81B 2203/0136* (2013.01);

(Continued)

(58) Field of Classification Search
None
See application file for complete search history.

(56) References Cited

U.S. PATENT DOCUMENTS 10,266,389 B2    4/2019  Pregl et al.
2013/0134530 A1*  5/2013  Kautzsch ............. B81C 1/0038
                                                257/417

(Continued)

OTHER PUBLICATIONS http://www.thesaurus.com/browse/align, 2018.

(Continued)

*Primary Examiner* — Nilufa Rahim
(74) *Attorney, Agent, or Firm* — Harrity & Harrity, LLP

(57) ABSTRACT

A method for forming a MEMS device may include performing a silicon-on-nothing process to form a cavity in a monocrystalline silicon substrate at a first depth relative to a top surface of the monocrystalline silicon substrate; forming, in an electrically conductive electrode region of the monocrystalline silicon substrate, an electrically insulated region extending to a second depth that is less than the first depth relative to the top surface of the monocrystalline silicon substrate; and etching the monocrystalline silicon substrate to expose a gap between a first electrode and a second electrode, wherein the second electrode is separated from the first electrode, within a first depth region, by a first distance defined by the electrically insulated region and the gap, and wherein the second electrode is separated from the first electrode, within a second depth region, by a second distance defined by the gap.

20 Claims, 21 Drawing Sheets

(52) U.S. Cl.
CPC .............. *B81B 2203/0181* (2013.01); *B81B 2203/0315* (2013.01); *B81B 2203/04* (2013.01); *B81B 2203/058* (2013.01); *B81C 2201/013* (2013.01); *B81C 2203/0136* (2013.01)

(56) References Cited

U.S. PATENT DOCUMENTS

2015/0274505 A1   10/2015  Molfese et al.
2017/0339494 A1   11/2017  Perletti et al.
2017/0369309 A1*  12/2017  Allegato ............... B81B 3/0097

OTHER PUBLICATIONS

Infineon, Infineon Technologies AG, 2016, 6 pages.
MacDonald N.C., "SCREAM MicroElectoMechanical Systems," Microelectronic Engineering, Sep. 1996, vol. 32 (1-4), pp. 49-73.

* cited by examiner

FORMING AN OFFSET IN AN INTERDIGITATED CAPACITOR OF A MICROELECTROMECHANICAL SYSTEMS (MEMS) DEVICE

RELATED APPLICATION

This application is a divisional of U.S. patent application Ser. No. 15/664,834, filed Jul. 31, 2017 (now U.S. Pat. No. 10,266,389), which is incorporated herein by reference.

BACKGROUND

A microelectromechanical system (MEMS) device may include a device, such as a transducer, a sensor, an actuator, and/or the like, produced using micro-machining techniques. A MEMS device may sense information from the environment by measuring a change in a physical state of the transducer and transferring a transduced signal to processing electronics that are connected to the MEMS device. A MEMS device may be manufactured using micro-machining fabrication techniques similar to those used for integrated circuits.

SUMMARY

According to some implementations, a method for forming a microelectromechanical system (MEMS) device may include performing a silicon-on-nothing process to form a cavity in a monocrystalline silicon substrate at a first depth relative to a top surface of the monocrystalline silicon substrate; forming, in an electrically conductive electrode region of the monocrystalline silicon substrate, an electrically insulated region extending to a second depth that is less than the first depth relative to the top surface of the monocrystalline silicon substrate; and etching the monocrystalline silicon substrate to expose a gap between a first electrode and a second electrode, wherein the second electrode is separated from the first electrode, within a first depth region, by a first distance defined by the electrically insulated region and the gap, and wherein the second electrode is separated from the first electrode, within a second depth region, by a second distance defined by the gap.

According to some implementations, a method for forming an interdigitated capacitive electrode structure may include performing a silicon-on-nothing process to form a cavity in a substrate that includes at least one electrically conductive electrode region; and forming a structured electrode region such that a gap extending from a top surface of the substrate to the cavity may be provided between a first electrode and a second electrode of the at least one electrically conductive electrode region, wherein, to form an offset, at least a portion of an end surface of the second electrode may be offset from an end surface of the first electrode relative to the top surface of the substrate.

According to some implementations, a microelectromechanical systems (MEMS) device may include a non-silicon-on-insulator (SOI) monocrystalline semiconductor substrate comprising a MEMS structure that includes a first electrode and a second electrode arranged to be movable relative to each other and separated by a gap, wherein the first electrode and the second electrode may be part of an interdigitated electrode structure and may be, within a first depth region, separated from each other by a first lateral distance and, within a second depth region, separated from each other by a second lateral distance.

DETAILED DESCRIPTION

The following detailed description of example implementations refers to the accompanying drawings. The same reference numbers in different drawings may identify the same or similar elements.

Figure 1:
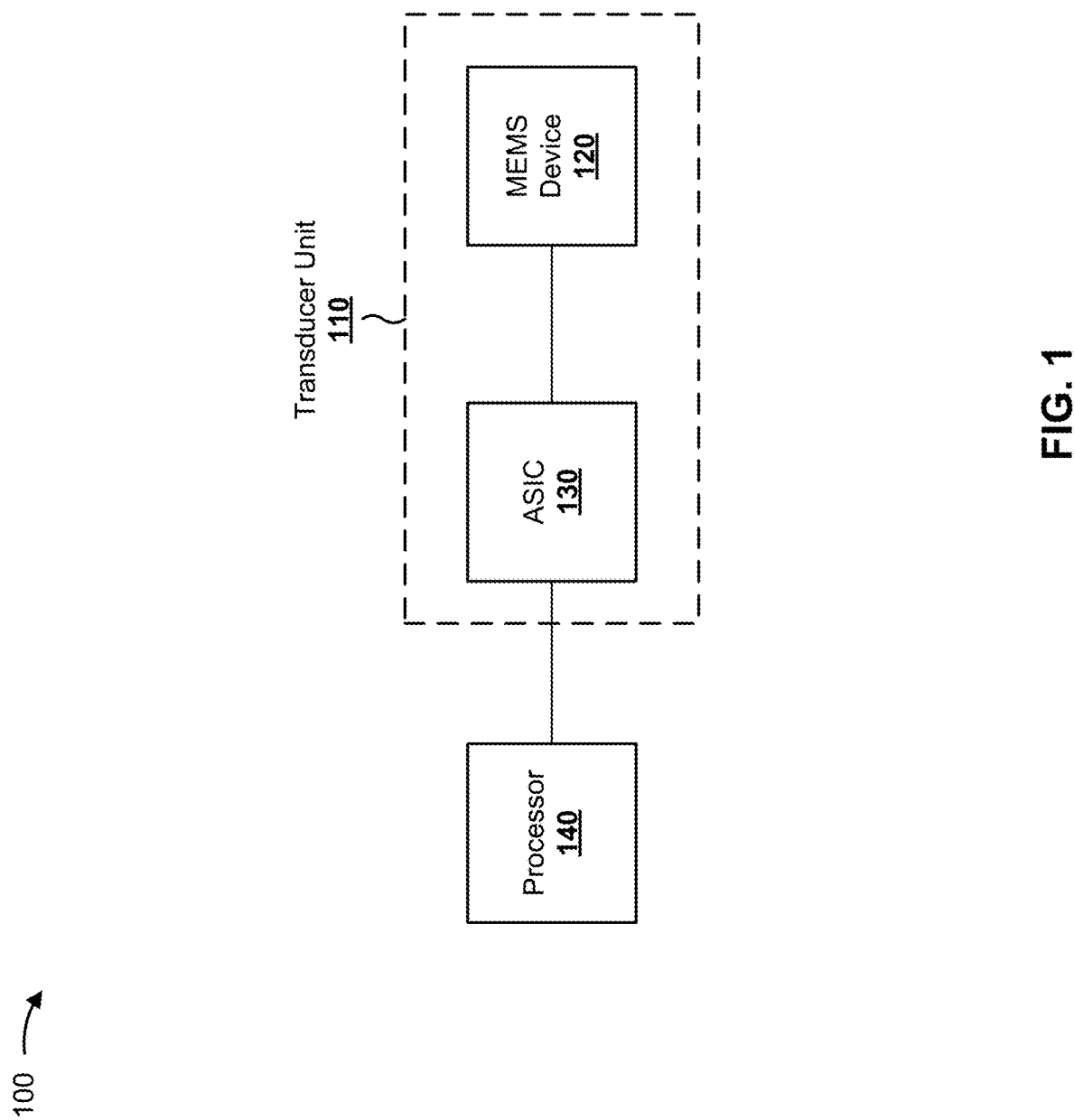
FIG. 1 is a diagram of an example system in which a MEMS device may operate.

FIG. 1 is a diagram of an example system 100 in which a MEMS device may operate. As shown in FIG. 1, system 100 may include a transducer unit 110, which may include a MEMS device 120 and an application-specific integrated circuit (ASIC) 130. As further shown, system 100 may include a processor 140. Components of system 100 may interact via wired connections, wireless connections, or some combination thereof.

Transducer unit 110 may include MEMS device 120 and ASIC 130. In some implementations, transducer unit 110 may be a packaged device, such as a packaged microphone, including a package opening, such as a sound port, for receiving a physical signal (e.g., by MEMS device 120). Additionally, or alternatively, transducer unit 110 may include a shared circuit board with separate semiconductor dies, for MEMS device 120 and ASIC 130, attached to the shared circuit board. In some implementations, MEMS device 120 and ASIC 130 may be assembled in a chip stack as a system-on-chip (SoC), such as through flip-chip bonding. In some implementations, MEMS device 120 and ASIC 130 may be integrated on a single semiconductor die (e.g., monolithically integrated) as an SoC.

MEMS device 120 may receive a physical signal, may generate a transduced signal based on the physical signal, and may provide the transduced signal to ASIC 130. For example, MEMS device 120 may provide an analog electrical signal, representative of the physical signal sensed by MEMS device 120, to ASIC 130. The analog electrical signal may include, for example, a single signal (e.g., a single-ended signal), a differential signal, or the like. In some implementations, MEMS device 120 may include a MEMS microphone, and the physical signal may include a pressure signal, such as an acoustic pressure wave. Additionally, or alternatively, MEMS device 120 may include a MEMS accelerometer, a MEMS gyroscope, a MEMS mirror structure, a MEMS Light Detection and Ranging (LIDAR) device, a MEMS sensor, a MEMS transducer, and/or the like.

ASIC 130 may generate an output signal based on the analog electrical signal from MEMS device 120, and may provide the output signal to processor 140. Additionally, or alternatively, ASIC 130 may perform other functions, such as providing a bias signal to MEMS device 120, supplying a constant charge and/or a constant voltage to MEMS device 120, implementing a buffer circuit, implementing an amplifier circuit for a signal from MEMS device 120, and/or the like. In some implementations, ASIC 130 may include an analog-to-digital converter (ADC), and may provide a digital signal, corresponding to an analog electrical signal received from MEMS device 120, to processor 140. Additionally, or alternatively, ASIC 130 may include an input/output circuit and/or a communication interface for communicating with processor 140.

Processor 140 is implemented in hardware, firmware, or a combination of hardware and software. Processor 140 may include a central processing unit (CPU), a graphics processing unit (GPU), an accelerated processing unit (APU), a microprocessor, a microcontroller, a digital signal processor (DSP), a field-programmable gate array (FPGA), an ASIC, or another type of processing component. In some implementations, processor 140 includes one or more processors capable of being programmed to perform a function. Processor 140 may receive a signal (e.g., an analog signal, a digital signal, and/or the like) from ASIC 130, and may perform processing based on the signal. In some implementations, such as when MEMS device 120 is a MEMS microphone, processor 140 may be a dedicated audio processor, such as an audio coder/decoder (CODEC). In some implementations, processor 140 may include or be connected to a memory device.

The number and arrangement of components shown in FIG. 1 are provided as an example. In practice, there can be additional components, fewer components, different components, or differently arranged components than those shown in FIG. 1. Furthermore, two or more components shown in FIG. 1 can be implemented within a single component, or a single component shown in FIG. 1 can be implemented as multiple, distributed components. Additionally, or alternatively, a set of components (e.g., one or more devices) of system 100 may perform one or more functions described as being performed by another set of components of system 100.

Figure 2:
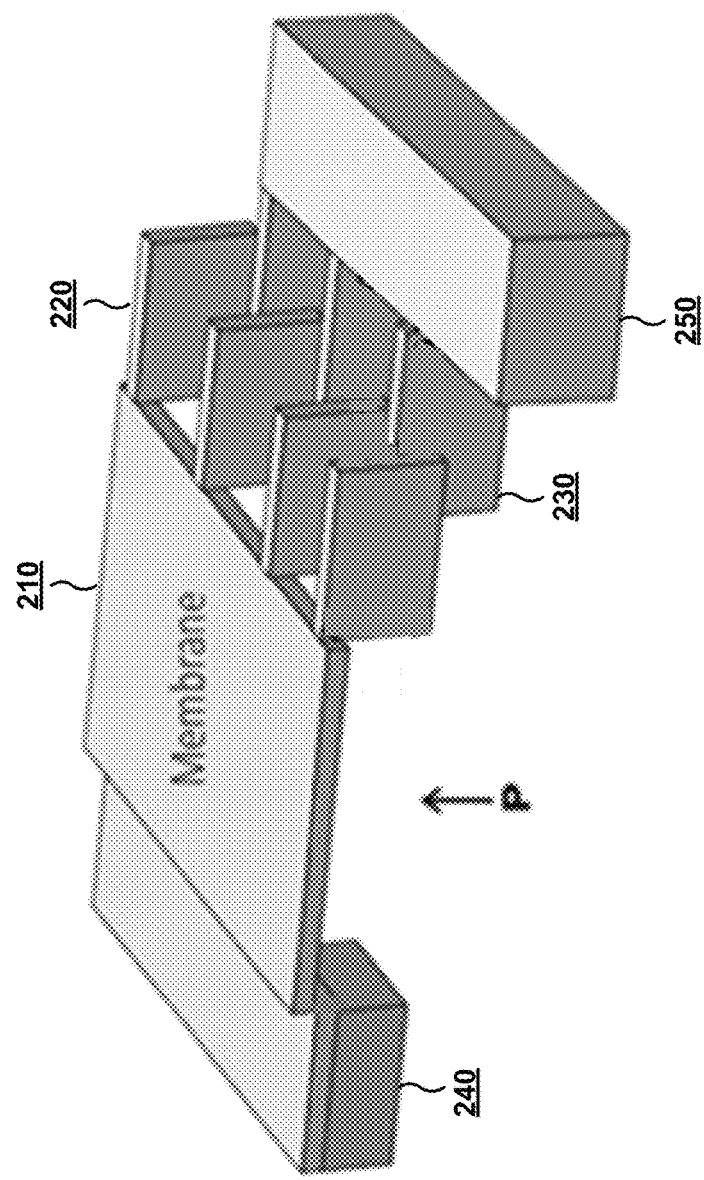
FIG. 2 is a diagram of an example MEMS device.

FIG. 2 is a diagram of an example MEMS device 200. In some implementations, MEMS device 200 corresponds to MEMS device 120 of FIG. 1. As shown in FIG. 2, MEMS device 200 may include a membrane 210, rotor comb-fingers 220, stator comb-fingers 230, an anchor 240, and a stator 250. In some implementations, MEMS device 200 is a MEMS microphone that includes a comb-drive transducer, such a pressure transducer (e.g., an acoustic pressure wave transducer). In some implementations, MEMS device 200 may include another type of transducer using a comb-drive mechanism, such as an accelerometer, a gyroscope, a mirror structure, a LIDAR device, and/or the like. An implementation in which MEMS device 200 is a pressure transducer is described below.

In some implementations, membrane 210 divides a first volume above membrane 210 from a second volume below membrane 210. As shown, pressure P, such as an acoustic pressure wave, may act on membrane 210 (e.g., from below, from above, etc.). In FIG. 2, pressure P is shown as acting from below membrane 210, which may correspond to a sound port or an opening in a package arranged to provide fluid communication with the bottom of membrane 210 (the second volume). As pressure P varies, membrane 210 deflects or oscillates, which produces a change in capacitance between rotor comb-fingers 220 and stator comb-fingers 230 because of the corresponding change in an overlapping area of the comb-fingers. Thus, an electrical signal may be generated that corresponds to variations in pressure P. For example, when pressure P represents a sound wave, an electrical signal may be produced between rotor comb-fingers 220 and stator comb-fingers 230 that represents the sound wave. In this case, rotor comb-fingers 220 and stator comb-fingers 230 may be biased with a bias voltage and coupled to a read out circuit (e.g., using ASIC 130, described above in connection with FIG. 1).

As shown, rotor comb-fingers 220 may be attached to membrane 210, which may be attached to anchor 240 (e.g., an anchor for membrane 210 and/or rotor comb-fingers 220). Further, stator comb-fingers 230 may be attached to stator 250, which may also be referred to as an anchor for stator comb-fingers 230. Anchor 240 and stator 250 may be fixed to a substrate or another rigid support structure in order to prevent movement, while membrane 210 may be formed in order to be thin and/or deflectable.

In some implementations, two or more structures shown in FIG. 2 (e.g., membrane 210, rotor comb-fingers 220, stator comb-fingers 230, anchor 240, and/or stator 250) may be formed of a same conductive or semiconductive layer, such as a monocrystalline silicon substrate, as described in more detail elsewhere herein. In some implementations, the monocrystalline silicon substrate is not a silicon-on-insulator (SOI) substrate or wafer (e.g., is a non-SOI monocrystalline semiconductor substrate or wafer). By forming multiple structures using the same material, bending may be reduced or equalized throughout the structure, and stress may be balanced uniformly across different structures of MEMS device 200, thereby improving performance of MEMS device 200. Further, geometries of different structures (e.g., a height of a structure, a width of a structure, a length of a structure, a spacing between structures, and/or the like) may be easily adjusted using the techniques described in more detail elsewhere herein, and may be formed with dimensions of a few hundred nanometers or less. Further, by using a non-SOI wafer, a cost of forming the MEMS device 200 may be reduced (e.g., by using a single silicon block of standard silicon wafer material).

The number and arrangement of structures shown in FIG. 2 are provided as an example. In practice, there can be additional structures, fewer structures, different structures, or differently arranged structures than those shown in FIG. 2.

Figure 3:
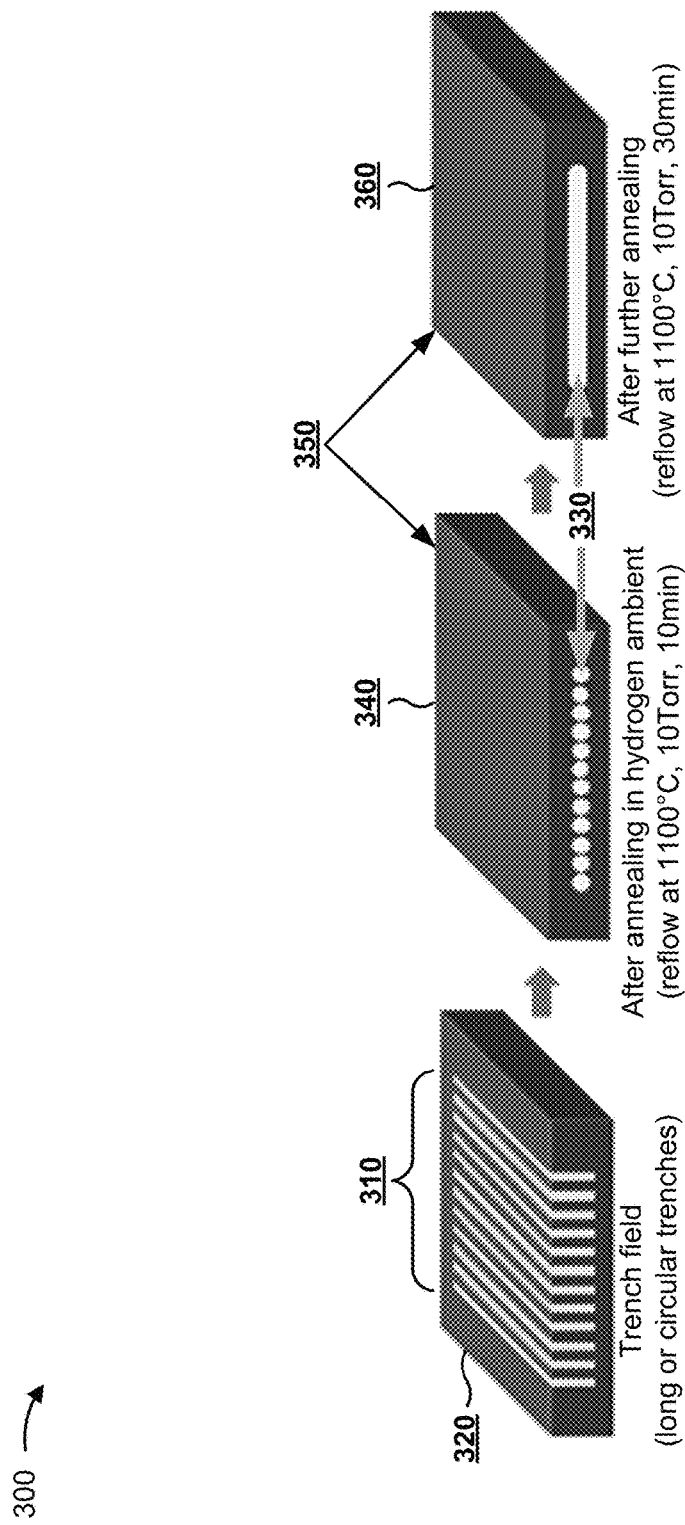
FIG. 3 is a diagram of an example silicon-on-nothing technique.

FIG. 3 is a diagram of an example silicon-on-nothing technique 300. As shown in FIG. 3, one or more trenches 310 may be etched in a substrate 320, such as a monocrystalline silicon substrate (e.g., which may be a non-SOI substrate or wafer, as described above), and the substrate 320 may undergo an annealing process to reflow the silicon to form one or more cavities 330. The trenches 310 may be etched in substrate 320 according to a pattern that matches a desired shape of the cavities 330. After the trenches 310 are etched in the substrate 320, an annealing process may be performed to reflow the silicon of substrate 320. For example, the annealing process may be performed in a low oxygen environment, such as a hydrogen environment, at a high temperature.

In some implementations, the annealing process may be performed at approximately 1100° C. at approximately 10 Torr of pressure for approximately 10 minutes. In this case, one or more cavities 330 may be formed to be substantially tubular, as shown by reference number 340. During the annealing process, the silicon columns or pillars between the trenches 310 will reflow, with the base of each trench 310 expanding and the top of each trench 310 collapsing. When the trenches 310 are spaced close together (e.g., within a threshold distance), the expanding bases of the trenches 310 will merge to form cavity or cavities 330 and the collapsing tops of the trenches 310 will also merge to form a silicon-on-nothing layer 350. Silicon-on-nothing layer 350 may be monocrystalline silicon.

In some implementations, the annealing process may be performed at approximately 1100° C. at approximately 10 Torr of pressure for approximately 30 minutes. In this case, a cavity 330 may be formed to be substantially flat, as shown by reference number 360. In some implementations, the spacing of the trenches 310 formed in substrate 320, the pressure, the temperature, the timing, the gas composition, and/or the like, used during the annealing process may be adjusted to form different shapes for cavity or cavities 330 with different thicknesses and/or dimensions.

In some implementations, a layer of material, such as an oxide liner, may be formed in cavity 330 (e.g., on the surfaces of cavity 330), and may act as an etch stop during an etching process, as described in more detail elsewhere herein. The layer of material may be a different material than the substrate 320 so as to act as an etch stop when etching substrate 320. For example, when the substrate 320 is monocrystalline silicon, the layer of material may be silicon oxide, silicon dioxide, and/or the like. In order to form the layer of material in cavity 330, an opening may be formed in silicon-on-nothing layer 350, and the material may be inserted in the cavity 330 through the opening. For example, silicon-on-nothing layer 350 may have a corner removed or a small hole formed to expose cavity 330 to an oxidizing process, such as a thermal oxidation process. In some implementations, the silicon-on-nothing technique may include a Venezia process for semiconductor material.

As indicated above, FIG. 3 is provided merely as an example. Other examples are possible and may differ from what was described with regard to FIG. 3.

Figure 4:
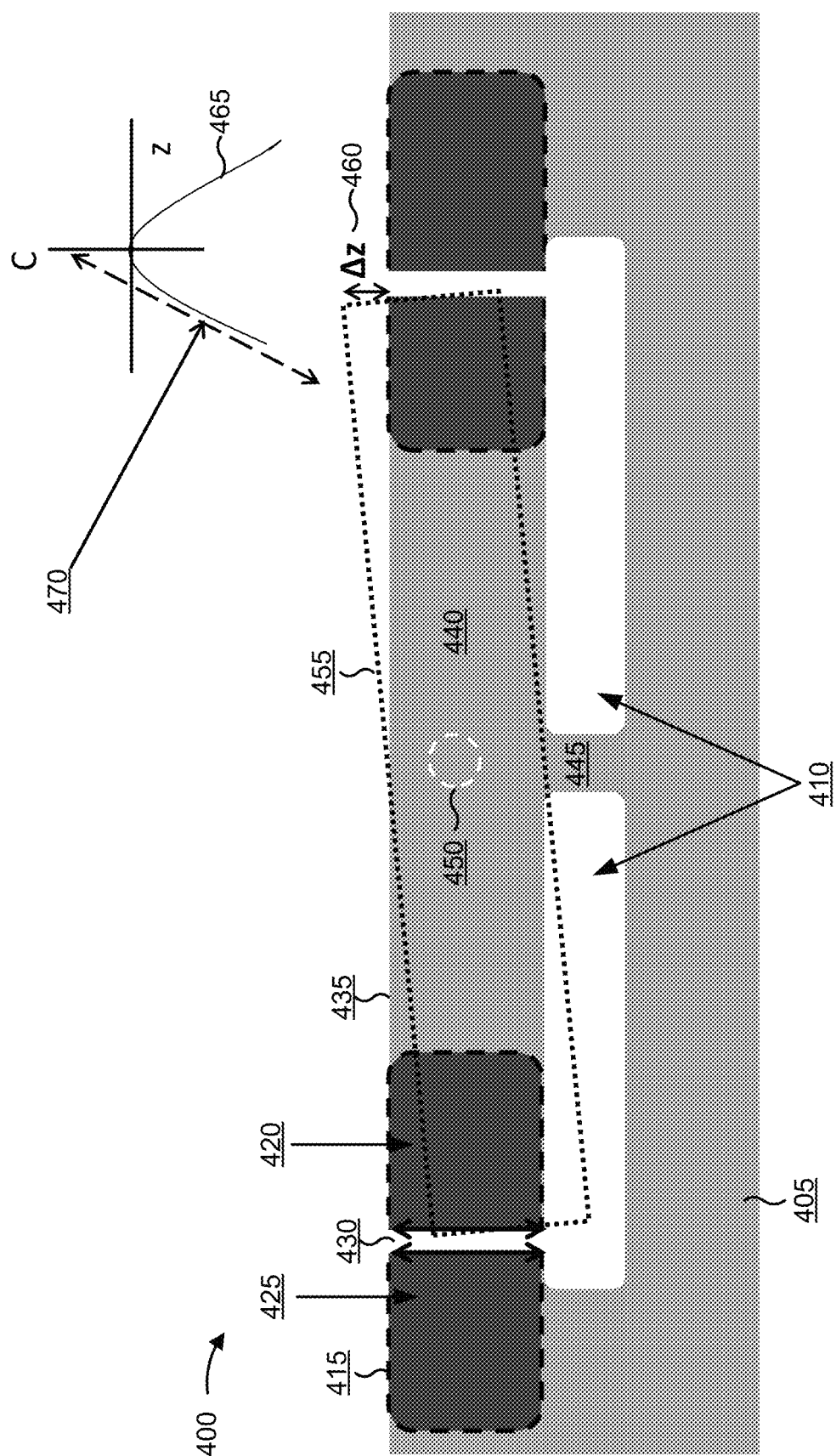
FIG. 4 is a diagram of an example MEMS device without an offset in an interdigitated capacitor.

FIG. 4 is a side view of an example MEMS device 400 without an offset in an interdigitated capacitor.

As shown in FIG. 4, MEMS device 400 may include a substrate 405 (shown in light gray) in which one or more cavities 410 (shown in white) have been formed. For example, a cavity 410 may be formed by performing a silicon-on-nothing process, as described above in connection with FIG. 3. As further shown, MEMS device 400 may include an electrically conductive electrode region 415 (shown in dark gray with a dashed outline), which may include a first electrode 420 (e.g., a movable electrode) and a second electrode 425 (e.g., a fixed electrode). The first electrode 420 and the second electrode 425 may be separated by a gap 430 (e.g., an air gap), shown in white. The gap 430 may extend from a top surface 435 of the substrate 405 to a cavity 410.

When acceleration, pressure, or a similar type of force is applied to MEMS device 400, such force results in a rotation or angular distortion of a mass 440 (e.g., a seismic mass, a proof mass, a test mass, and/or the like) supported by a supporting spring 445. For example, the mass 440 may rotate (e.g., deflect, bend, etc.) around an axis 450, which may temporarily result in a rotated mass 455 (shown as a dotted outline), which may later return to an initial position after such rotation. The rotation of mass 455 causes the ends of mass 455, including the first electrode 420, to be deflected by a distance 460 along a z-axis. This deflection causes a change in capacitance C between the first electrode 420 and the second electrode 425 due to a change in electrode overlap and/or a distance between the electrodes. The change in capacitance may be measured to determine a force being applied to MEMS device 400 (e.g., an acceleration, a pressure, and/or the like).

As shown by reference number 465, when the first electrode 420 and the second electrode 425 are not offset from one another (e.g., in a direction parallel to the top surface 435 of the substrate 405), as shown in FIG. 4, then there may be a non-linear relationship between the capacitance C and the distance of deflection z (or the angle of rotation). This non-linear relationship may be undesirable because a function of capacitance C and deflection z (i.e., C(z)) may be flat in an initial undeflected state (i.e., there is a local maximum in the undeflected state). Accordingly, a derivative of C(z) (dC/dz), which may correspond to a sensitivity, is zero. Therefore, there may not be a sensor signal for small deflections of z (small Δz) for electrode pairs (e.g., pairs of a rotor electrode and a stator electrode). As such, regardless of a differential readout, where only one pair is measured, there may be no observable signal. Furthermore, the non-linear relationship between the capacitance C and the distance of deflection z may be undesirable for relatively large deflections. For example, although a capacitance change may be measured when approaching a more linear regime, a differential signal of opposing electrodes may not be obtained because a capacitance change associated with two possible distances of deflection (+z and −z) or angles of rotation may be the same, thereby reducing distinguishability of measurements as compared to a linear relationship 470. Furthermore, when electrode pairs on opposite ends of the mass 440 have the same geometry, this may lead to a vanishing signal (e.g., of zero) when measuring a differential signal between electrode pairs because the amount of deflection z or rotation are equal, but in opposite directions, at each electrode pair. Accordingly, a non-linear relationship between capacitance C and distance of deflection z may be undesirable because, for small distances of deflection z, there may be no observable signal and, for large distances of deflection, there may be a small, non-linear signal for a single electrode pair and/or no signal for a differential readout.

By offsetting the first electrode 420 and the second electrode 425 in a direction parallel to the top surface 435 of the substrate 405, the above issues of non-linearity and vanishing signals may be reduced or eliminated. In some cases, an offset may be introduced using stress engineering (e.g., using one or more springs 445 of differing lengths than that shown, so that the first electrode 420 is offset from the second electrode 425). However, such stress engineering may introduce a large sensor sensitivity spread due to a non-reproducible stress and/or variations in stress across the mass 440 and/or substrate 405. Furthermore, the amount of stress may drift over time, which may lead to sensor drifts and inaccuracies.

Some techniques described herein may be used to form an electrically insulated region within the electrically conductive electrode region 415 of the MEMS device 400, resulting in an offset between the first electrode 420 and the second electrode 425. These techniques may result in more uniform stress across the MEMS device 400 and less sensor drift over time, thereby improving sensor accuracy. Additional details are described below in connection with FIGS. 5A-12.

As indicated above, FIG. 4 is provided merely as an example. Other examples are possible and may differ from what was described with regard to FIG. 4.

Figure 5A:
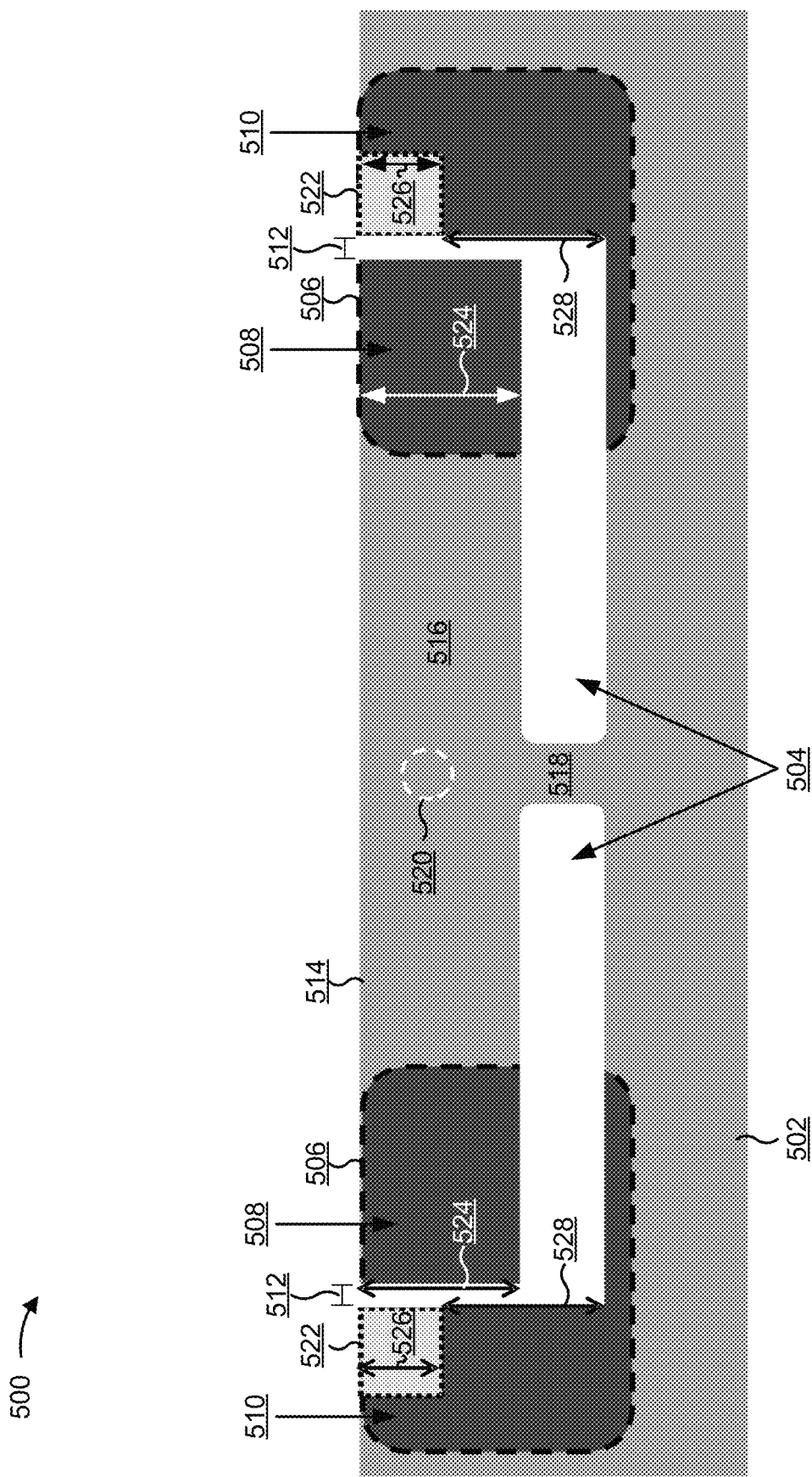
FIGS. 5A, 5B, and 6-9 are diagrams of example MEMS devices with an offset in an interdigitated capacitor.
Figure 5B:
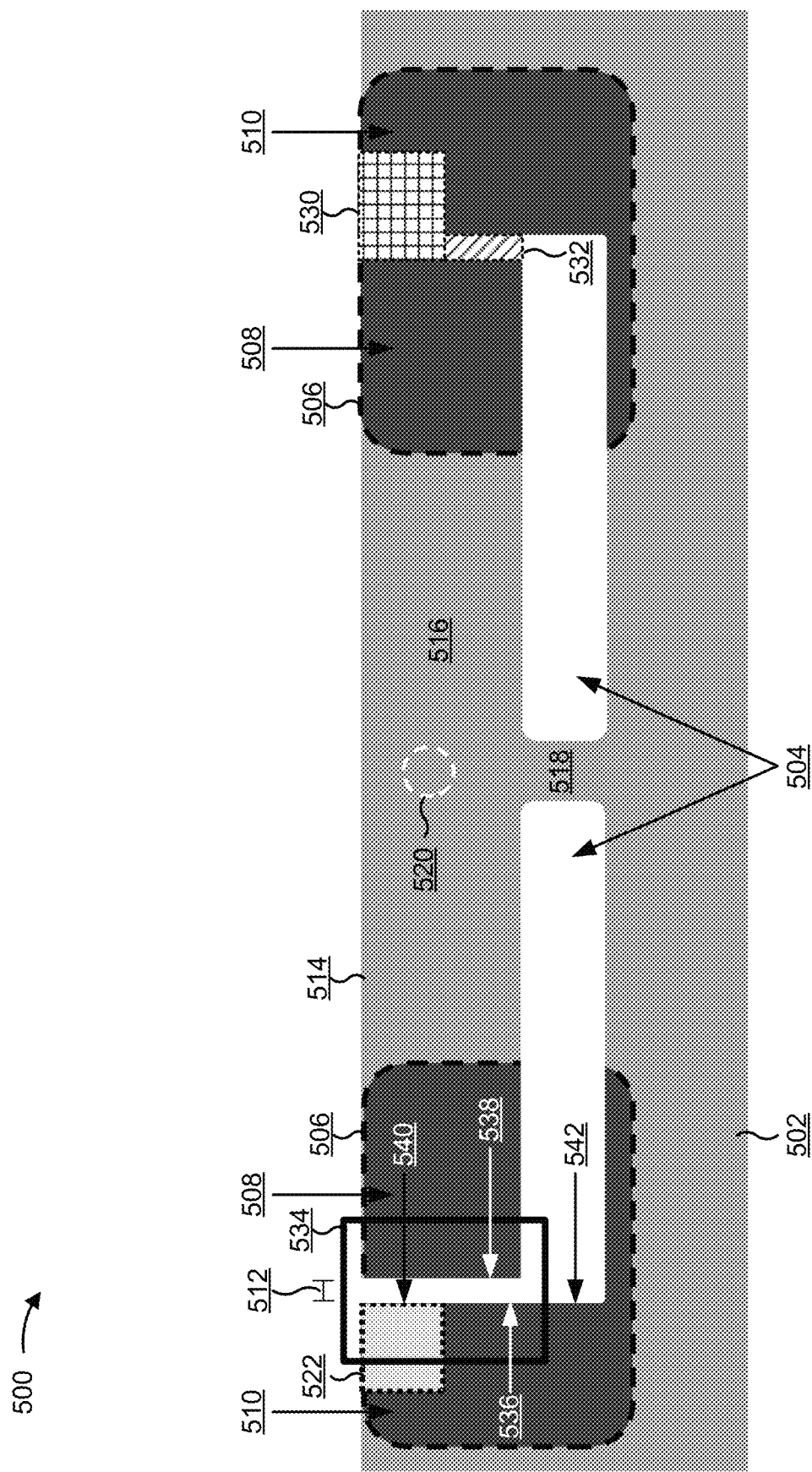

FIGS. 5A and 5B are side views of an example MEMS device 500 with an offset in an interdigitated capacitor.

As shown in FIG. 5A, and as described above in connection with FIG. 4, MEMS device 500 may include a substrate 502 (shown in light gray) in which one or more cavities 504 (shown in white) have been formed. For example, the one or more cavities 504 may be formed by performing a silicon-on-nothing process, as described above in connection with FIG. 3. In some implementations, the substrate may be a monocrystalline silicon substrate. For example, the substrate 502 may be a non-silicon-on-insulator (SOI) monocrystalline semiconductor substrate. As further shown, MEMS device 500 may include an electrically conductive electrode region 506 (shown in dark gray with a dashed outline), which may include a first electrode 508 (e.g., a movable electrode) and a second electrode 510 (e.g., a fixed electrode). In some implementations, the first electrode 508 may be an electrode of a rotor comb-finger (e.g., one of the rotor comb-fingers 220) and the second electrode 510 may be an electrode of a stator comb-finger (e.g., one of the stator comb-fingers 230). The first electrode 508 and the second electrode 510 may be separated by a gap 512 (e.g., an air gap), shown in white. The gap 512 may extend from a top surface 514 of the substrate 502 to a cavity 504.

As described above in connection with FIG. 4, the first electrode 508 may be positioned at the end of a mass 516. The mass 516 may be supported by a supporting spring 518, and may rotate around an axis 520 (e.g., out-of-plane movement) and/or may move laterally (e.g., in-plane movement). Thus, in some implementations, the first electrode 508 may be movable relative to the second electrode 510. As shown, in some implementations, the MEMS device 500 may include a pair of electrically conductive electrode regions 506 with a first electrode 508 of each pair being positioned at opposite ends of the mass 516. Additionally, or alternatively, the MEMS device 500 may include multiple of such structures (e.g., masses 516) that form an interdigitated capacitive electrode structure (e.g., an interdigitated capacitor, an interdigitated electrode structure, and/or the like), as described above in connection with FIG. 2.

In some implementations, the MEMS device 500 may include an electrically insulated region 522 (e.g., shown in light gray with a dotted outline) within the electrically conductive electrode region 506. In some implementations, a cavity 504 may be positioned at a first depth 524 relative to the top surface 514 of the substrate 502, and the electrically insulated region 522 may extend from the top surface 514 to a second depth 526, where the second depth 526 is less than the first depth 524 relative to the top surface 514. In some implementations, a height of the first electrode 508 (e.g., a height represented by the first depth 524) may be approximately equal to (e.g., the same as) a height 528 of the second electrode 510 (e.g., within a tolerance range). Additionally, or alternatively, a height of an offset between the first electrode 508 and the second electrode 510 due to the electrically insulated region 522 (e.g., a height represented by the second depth 526) may be approximately half the height of the first electrode 508 and/or the second electrode 510 (e.g., within a tolerance range).

In this configuration, a readout based on the first electrode 508 and the second electrode 510 may exhibit a linear relationship between capacitance and an offset of the first electrode 508 and the second electrode 510 due to deflection or rotation. Furthermore, a differential signal measurement may not vanish when the distance of deflection is equal but opposite on opposite ends of the mass 516.

As shown in FIG. 5B, in some implementations, within a first depth region 530 of the electrically conductive electrode region 506, the second electrode 510 may be separated from the first electrode 508 by a first distance (e.g., a first lateral distance). The first distance may be the width of the first depth region 530, which, in some cases, may be defined by a combined width of the electrically insulated region 522 and width of the gap 512. As further shown, within a second depth region 532 of the electrically conductive electrode region 506, the second electrode 510 may be separated from the first electrode 508 by a second distance (e.g., a second lateral distance). The second distance may be the width of the second depth region 532, which, in some cases, may be defined by a width of the gap 512 (e.g., and may not include the width of the electrically insulated region 522). In some implementations, the first distance may be different than the second distance. For example, as shown, the first distance (e.g., the width of the first depth region 530) may be greater than the second distance (e.g., the width of the second depth region 532). As further shown, the first depth region 530 may be positioned closer to the top surface 514 of the substrate 502 than the second depth region 532. Additionally, or alternatively, the cavity 504 may be positioned farther from the top surface 514 than the first depth region 530 and the second depth region 532.

As further shown in FIG. 5B, in some implementations, the MEMS device 500 may include a structured electrode region 534 (e.g., a MEMS structure). The structured electrode region 534 may include the gap 512 extending from the top surface 514 of the substrate 502 to the cavity 504. The gap 512 may be positioned between the first electrode 508 and the second electrode 510 of the electrically conductive electrode region 506. In some implementations, at least a portion of an end surface 536 of the second electrode 510 is offset from an end surface 538 of the first electrode 508 relative to the top surface 514 of the substrate 502. For example, the end surface 536 of the second electrode 510 may be offset from the end surface 538 of the first electrode 508 by the second depth 526 of the electrically insulated region 522. As shown, the end surface 536 of the second electrode 510 and the end surface 538 of the first electrode 508 may face one another. In some implementations, the end surface 538 of the first electrode 508 may be positioned closer than the cavity 504 to the top surface 514 of the substrate 502 and the end surface 536 of the second electrode 510 may be positioned farther than the electrically insulated region 522 from the top surface 514 of the substrate 502.

In some implementations, the electrically insulated region 522 is a trench formed by recessing a dielectric material (e.g., performing a shallow trench isolation (STI) process), as described in more detail elsewhere herein. Additionally, or alternatively, an edge 540 of the electrically insulated region 522 (e.g., an edge of the trench) may be approximately aligned with an edge 542 of the cavity 504 (e.g., within a tolerance range).

In one or more of these configurations, a readout based on the first electrode 508 and the second electrode 510 may exhibit a linear relationship between capacitance and an offset of the first electrode 508 and the second electrode 510 due to deflection or rotation of the mass 516 that include at least one first electrode 508. Furthermore, a differential signal measurement may not vanish when the distance of deflection is equal but opposite on opposite ends of the mass 516.

As indicated above, FIGS. 5A and 5B are provided as examples. Other examples are possible and may differ from what was described with regard to FIGS. 5A and 5B.

Figure 6:
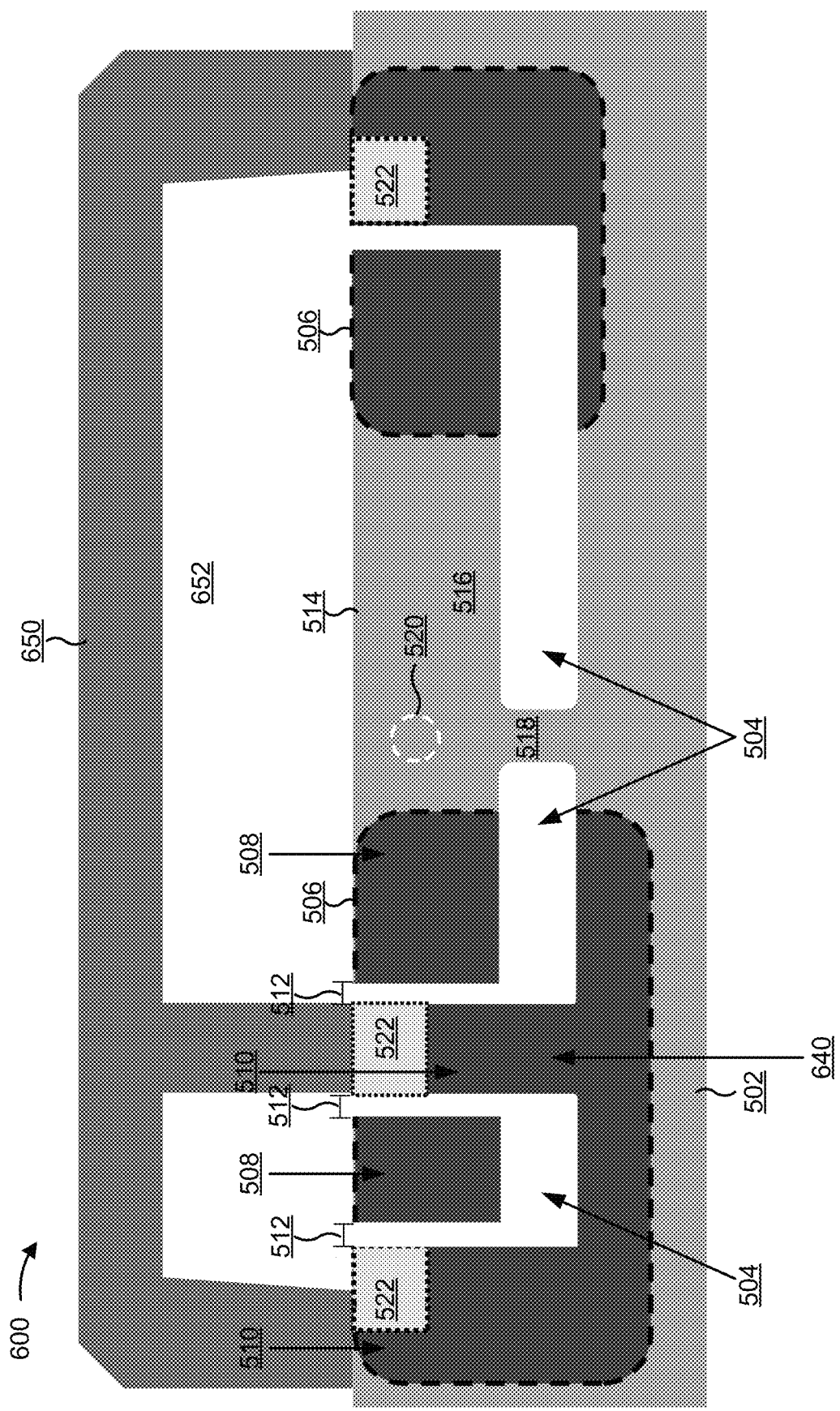

FIG. 6 is a diagram of another example MEMS device 600 with an offset in an interdigitated capacitor. In FIG. 6, the reference numbers in common with FIGS. 5A and 5B identify the same or similar elements. For example, MEMS device 600 may include a substrate 502, one or more cavities 504, one or more electrically conductive electrode regions 506, first electrodes 508 and second electrodes 510 separated by a gap 512 along a first portion of facing ends of the first electrodes 508 and second electrodes 510 and separated by the gap 512 and an electrically insulated region 522 along a second portion of the facing ends, a top surface 514 of the substrate 502, a mass 516 that rotates around an axis 520 and is supported by a supporting spring 518, and/or one or more other features described above in connection with FIGS. 5A and/or 5B.

As shown in FIG. 6, in some implementations, the MEMS device 600 may include three cavities 504. In some implementations, the MEMS device 600 may include more than three cavities 504, such as four cavities 504, five cavities 504, etc. Additionally, or alternatively, an electrically conductive electrode region 506 may include multiple sets of electrodes, such as two pairs of a first electrode 508 and a second electrode 510, as shown in FIG. 6. In some implementations, the first electrodes 508 and second electrodes 510 may be offset due to formation of an electrically insulated region 522, as described elsewhere herein.

As further shown in FIG. 6, in some implementations, one of the second electrodes 510 is formed on a pillar 640 that extends from the base of the cavity 504. The pillar 640 may be formed within the electrically conductive electrode region 506 between the first electrodes 508. The pillar 640 may be formed from the gap 512 between the first electrodes 508 and the second electrodes 510. The pillar 640 may include the insulated region 522 to offset the second electrode 510 of the pillar with the first electrodes 508. The pillar 640 may be or may form a stator comb-finger (e.g., similar to stator comb-fingers 230 of FIG. 2) that includes the insulated region 522 in the electrically conductive electrode region 506. As such, the first electrodes 508 may move based on a rotation of the mass 516 about the rotational axis 520 while the second electrodes 510 remain fixed to the substrate 502. In some implementations, a conductive region similar to the electrically conductive electrode region 506 may be formed opposite the electrically conductive electrode region 506 relative to the mass 516. Accordingly, multiple pillars 640 may be formed in electrically conductive electrode regions 506 of the substrate 502.

As further shown in FIG. 6, in some implementations a cap 650 (e.g., a thin film cap) may be included above the substrate 502, opposite the cavities 504 relative to the top surface 514. In some implementations, a plurality of pillars similar to pillar 640 (and/or a pillar without an insulated region 522) may be included (e.g., in front of or behind the pillar 640) in the substrate 502 to support the cap 650. The cap 650 may enclose one or more compartments 652 between the top surface 514 and the cap 650. For example, the cap 650 may be used to protect the substrate 502, such as to prevent physical contact between the mass 516 and another object, to maintain cleanliness of the substrate, and/or the like. The one or more compartments 652 may be a vacuum or may include a gas, a fluid, or a solid. Accordingly, the substrate 502 may include pillars 640 with an insulated region as described herein that may be used to support a cap 650 without the pillars 640 affecting capacitance of the MEMS device 600.

As indicated above, FIG. 6 is provided merely as an example. Other examples are possible and may differ from what was described with regard to FIG. 6.

Figure 7:
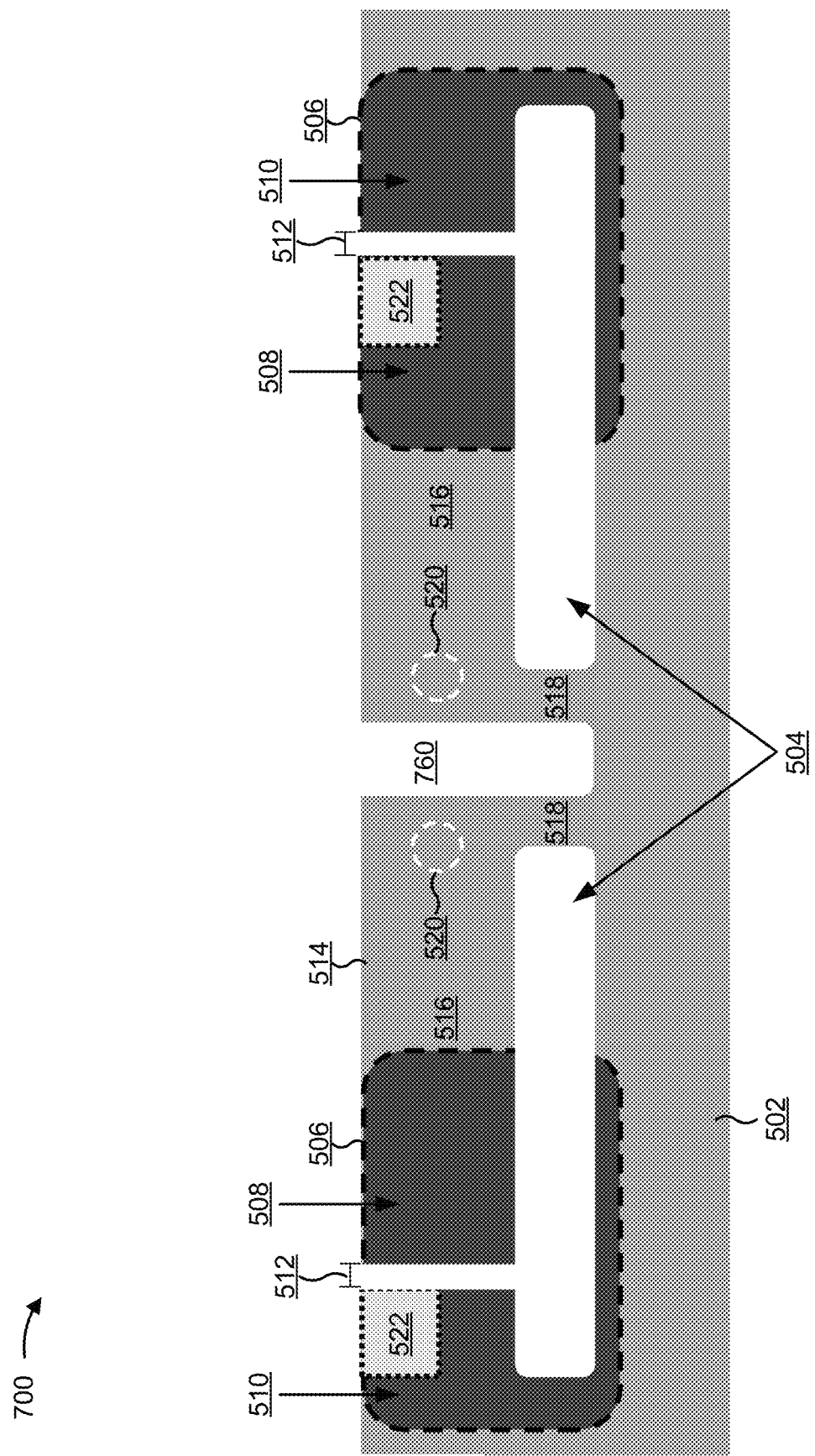

FIG. 7 is a diagram of another example MEMS device 700 with an offset in an interdigitated capacitor. In FIG. 7, the reference numbers in common with FIG. 5 identify the same or similar elements. For example, MEMS device 700 may include a substrate 502, one or more cavities 504, at least one electrically conductive electrode region 506, first electrodes 508 and second electrodes 510 separated by a gap 512 along a first portion of facing ends of the first electrodes 508 and the second electrodes 510 and separated by the gap 512 and an electrically insulated region 522 along a second portion of the facing ends, a top surface 514 of the substrate 502, and/or one or more other features described above in connection with FIGS. 5A and/or 5B.

As shown in FIG. 7, a mass 516 and/or supporting spring 518 may be separated by a dividing cavity 760 that effectively creates multiple masses 516 and/or multiple supporting springs 518. Accordingly, the masses 516 of FIG. 7 each rotates (e.g., deflects or bends) around separate axes 520 and are supported by separate supporting springs 518. In some implementations, the dividing cavity 760 may be formed using a silicon-on-nothing process and/or an etching process that separates the mass 516 and/or supporting spring 518. Accordingly, in the example of FIG. 7, readouts based on the first electrode 508 and the second electrode 510 from opposite ends may have different readings (e.g., different magnitudes) due to potential different deflections or rotations of the masses 516 on opposite ends of the substrate 502.

As indicated above, FIG. 7 is provided merely as an example. Other examples are possible and may differ from what was described with regard to FIG. 7.

Figure 8:
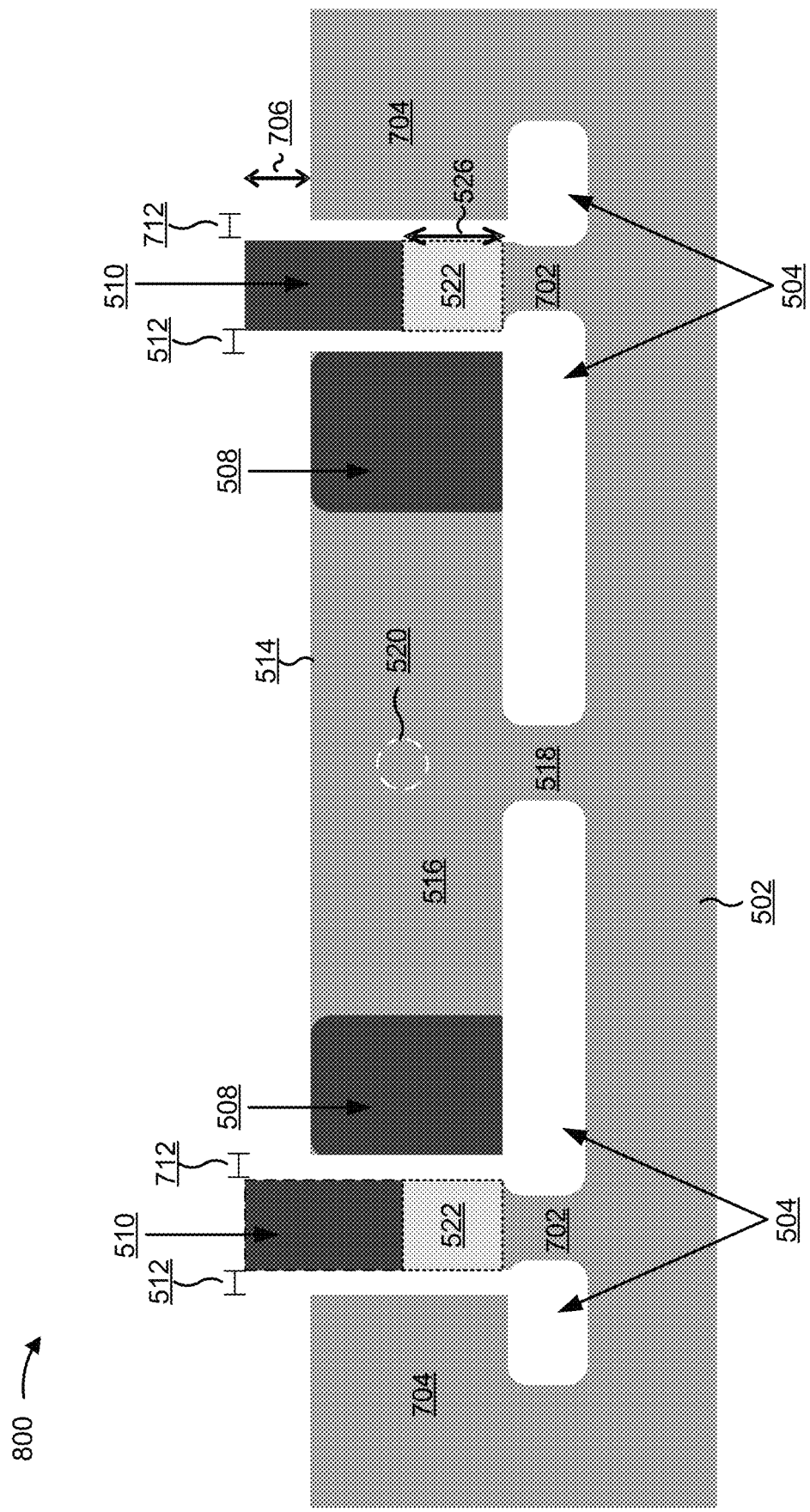

FIG. 8 is a diagram of another example MEMS device 800 with an offset in an interdigitated capacitor. In FIG. 8, the reference numbers in common with FIGS. 5A and 5B identify the same or similar elements. For example, MEMS device 800 may include a substrate 502, one or more cavities 504, first electrodes 508 and second electrodes 510 separated by a gap 512 along a first portion of facing ends of the first electrodes 508 and the second electrodes 510 and separated by the gap 512 and one or more electrically insulated regions 522 along a second portion of the facing ends, a top surface 514 of the substrate 502, and/or one or more other features described above in connection with FIGS. 5A and/or 5B.

As shown in FIG. 8, in some implementations, the MEMS device 800 may include one or more supports 702 in the cavities 504 that support the one or more insulated regions 522, which offsets the first electrodes 508 from the second electrodes 510. The supported second electrode 510 may be separated from an outer portion 704 of the substrate 502 by a gap 712, such that the support 702, the insulated region 522, and the second electrode 510 extend from the base of the cavity 504. In some implementations, the outer portion 704 of the substrate 502 may include an electrode (e.g., similar to the electrodes 508, 510). In some implementations, a height of the insulated region 522 may be substantially the same as a height 706 of the offset and/or the heights of the first electrode 508 may be the same a height of the second electrode.

As shown in FIG. 8, the insulated region 522 includes a dielectric (e.g., an insulating material) that is capable of supporting the second electrode 510. Accordingly, when there is a rotation (e.g., a bend or deflection) of the mass 516 the first electrodes 508 and/or the second electrodes 510 may be read out differentially, when, with acceleration g, a differential the distance of deflection z and the acceleration (dz/dg) is opposite on opposite sides of the substrate 502. Or, the first electrodes 508 and/or second electrodes 510 may be read out in parallel for a rotation of the mass when dz/dg is equal (or substantially equal) on opposite sides of the substrate 502.

As indicated above, FIG. 8 is provided merely as an example. Other examples are possible and may differ from what was described with regard to FIG. 8.

Figure 9:
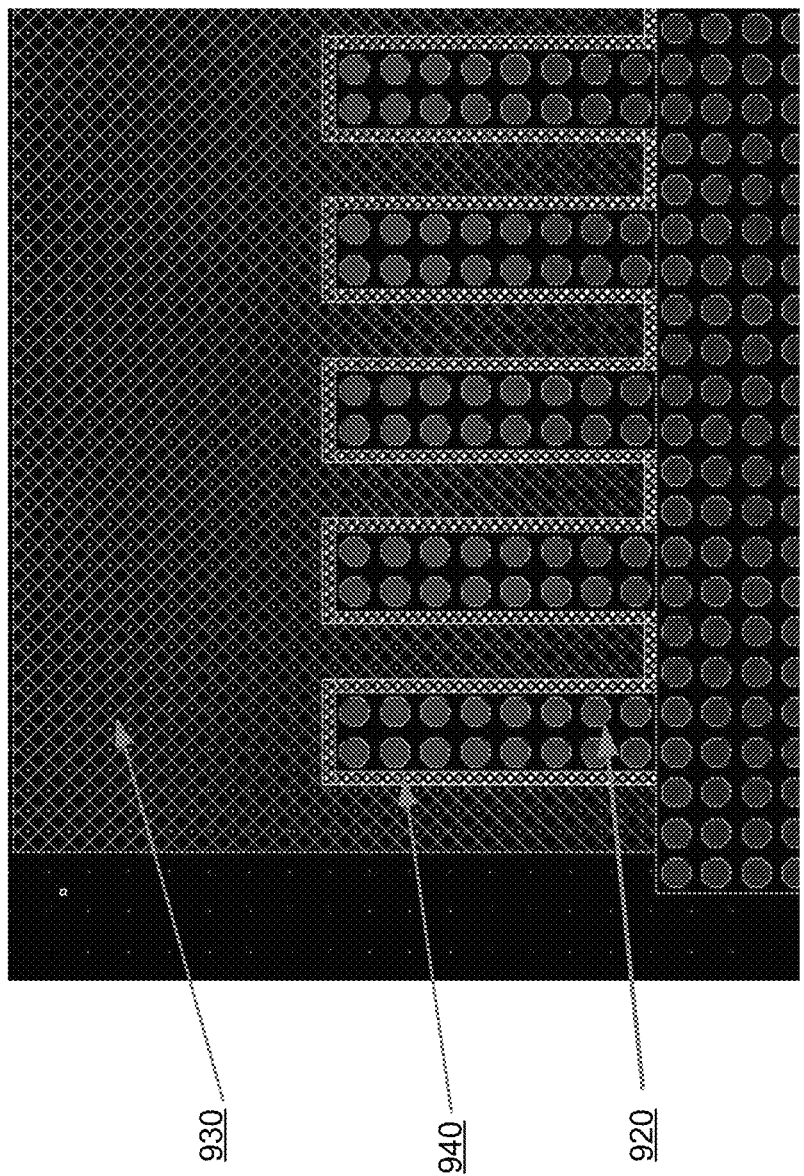

FIG. 9 is a diagram of another example MEMS device 900 with an offset in an interdigitated capacitor. In FIG. 9, a top view of a MEMS device 900 is shown. For example, the MEMS device 900 shown in FIG. 9 may include a plurality of substrates 502 with a plurality of corresponding masses 516. The example MEMS device may include a rotor 920, a stator 930, and a trench 940 between the rotor 920 and the stator 930. In some implementations, the rotor 920 may include first electrodes 508 and the stator 930 may include second electrodes 510. In some implementations, the trench 940 is formed from the insulated region 522 and/or the gap 512 using a shallow trench isolation (STI) process.

Figure 10A:
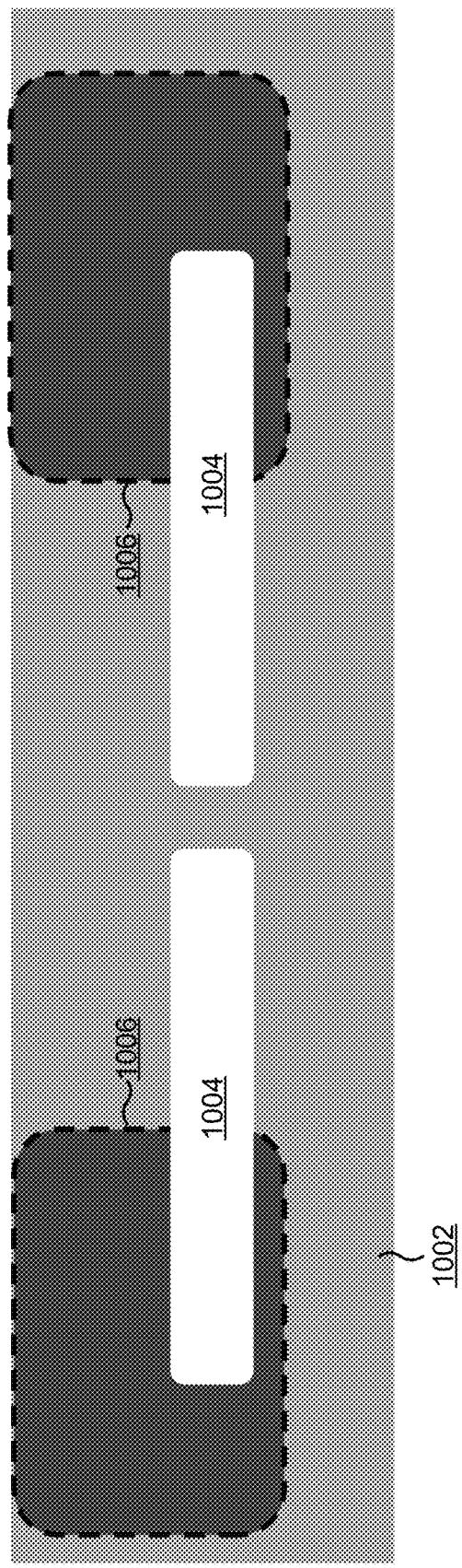
FIGS. 10A-10I are diagrams of an example process for forming a MEMS device with an offset in an interdigitated capacitor.
Figure 10B:
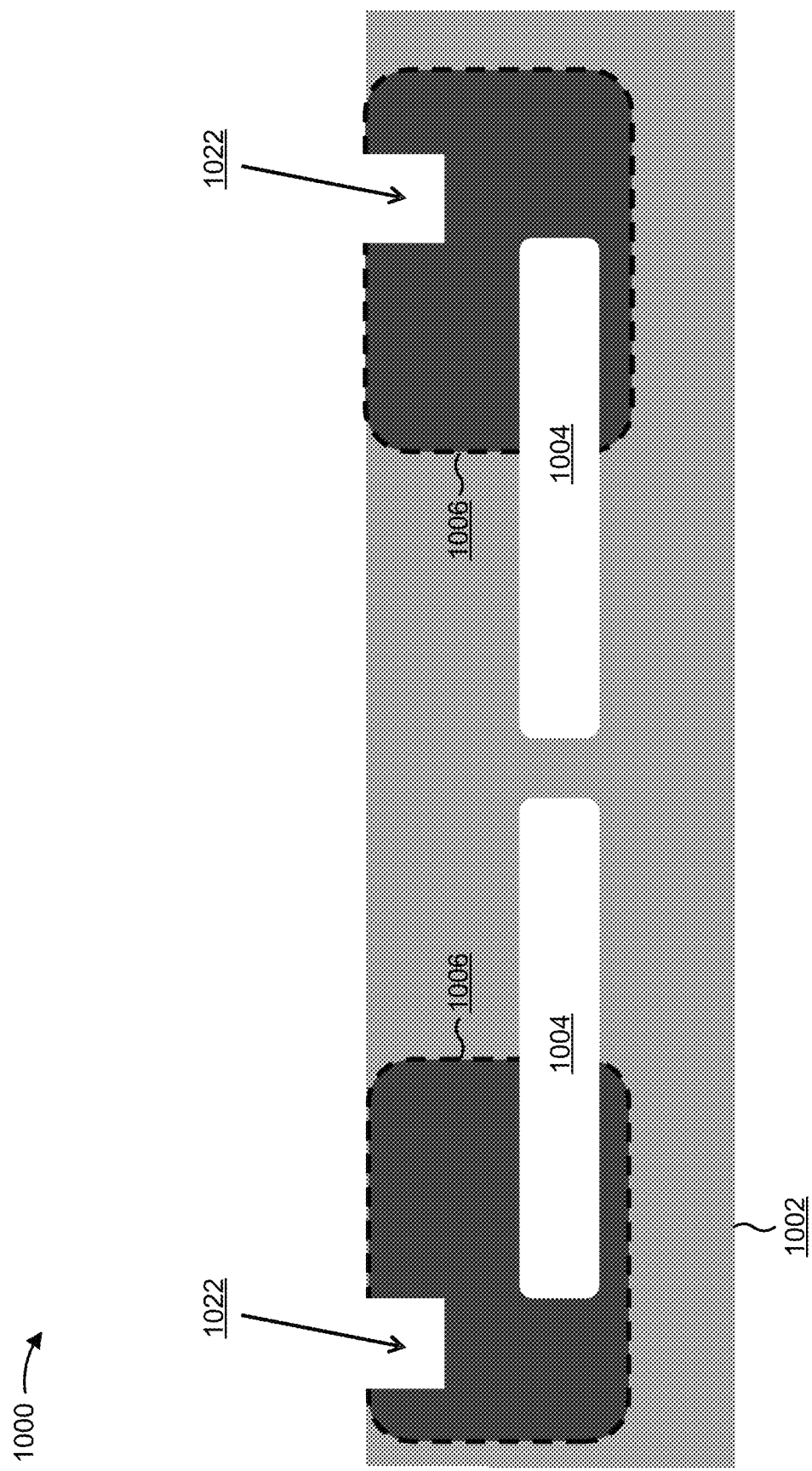

FIGS. 10A-10I are diagrams of an example process for forming a MEMS device with an offset in an interdigitated capacitor. In FIG. 10A, a substrate 1002 is formed to include cavities 1004 via a silicon-on-nothing process and formed to include electrode regions 1006. In FIG. 10B, insulated regions 1022 are formed (e.g., via an STI process, such as a silicon etch). For example, in FIG. 10B, the insulated regions 1022 may be aligned with edges of the cavities 1004 formed from the silicon-on-nothing process.

Figure 10C:
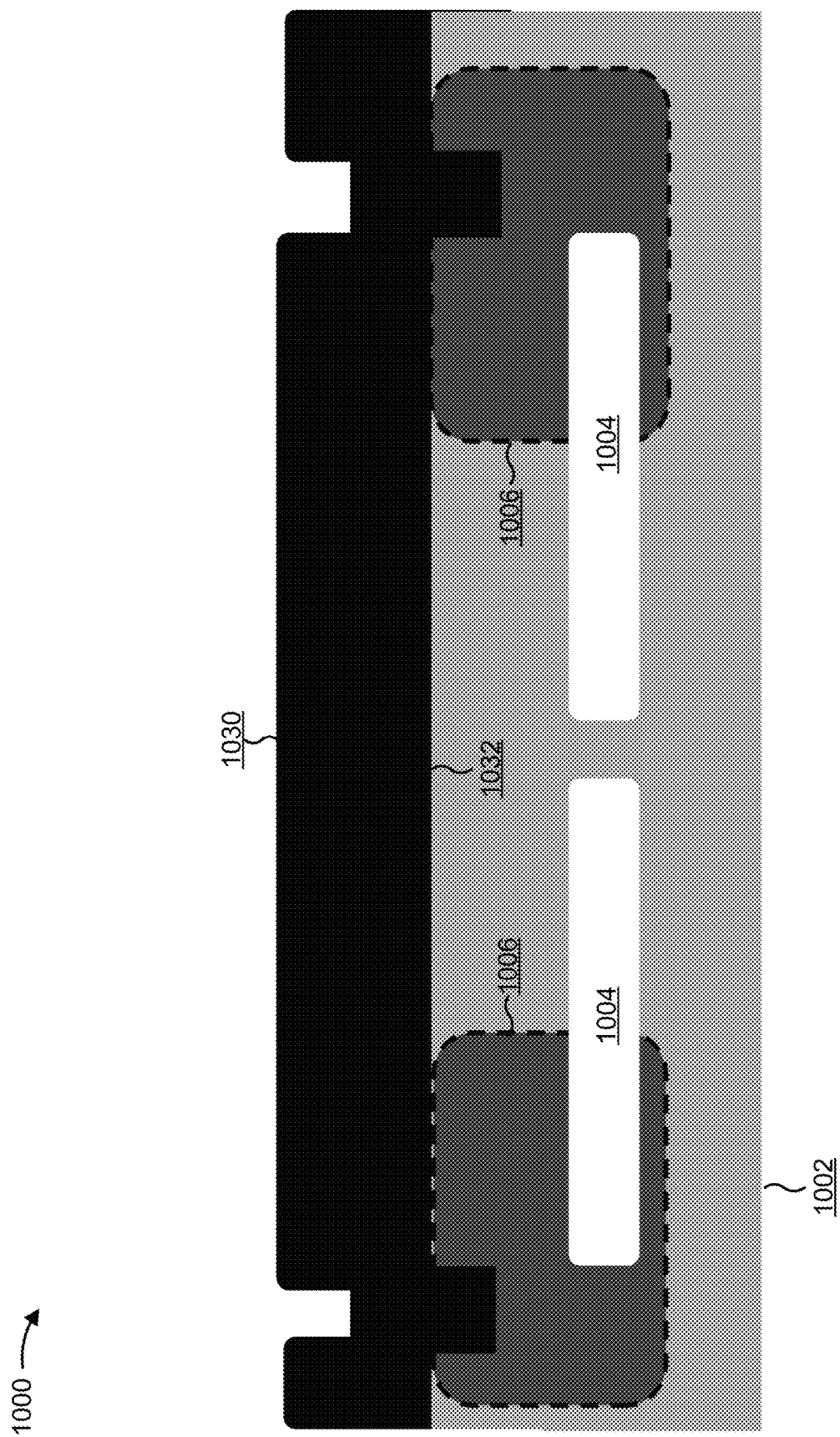
Figure 10D:
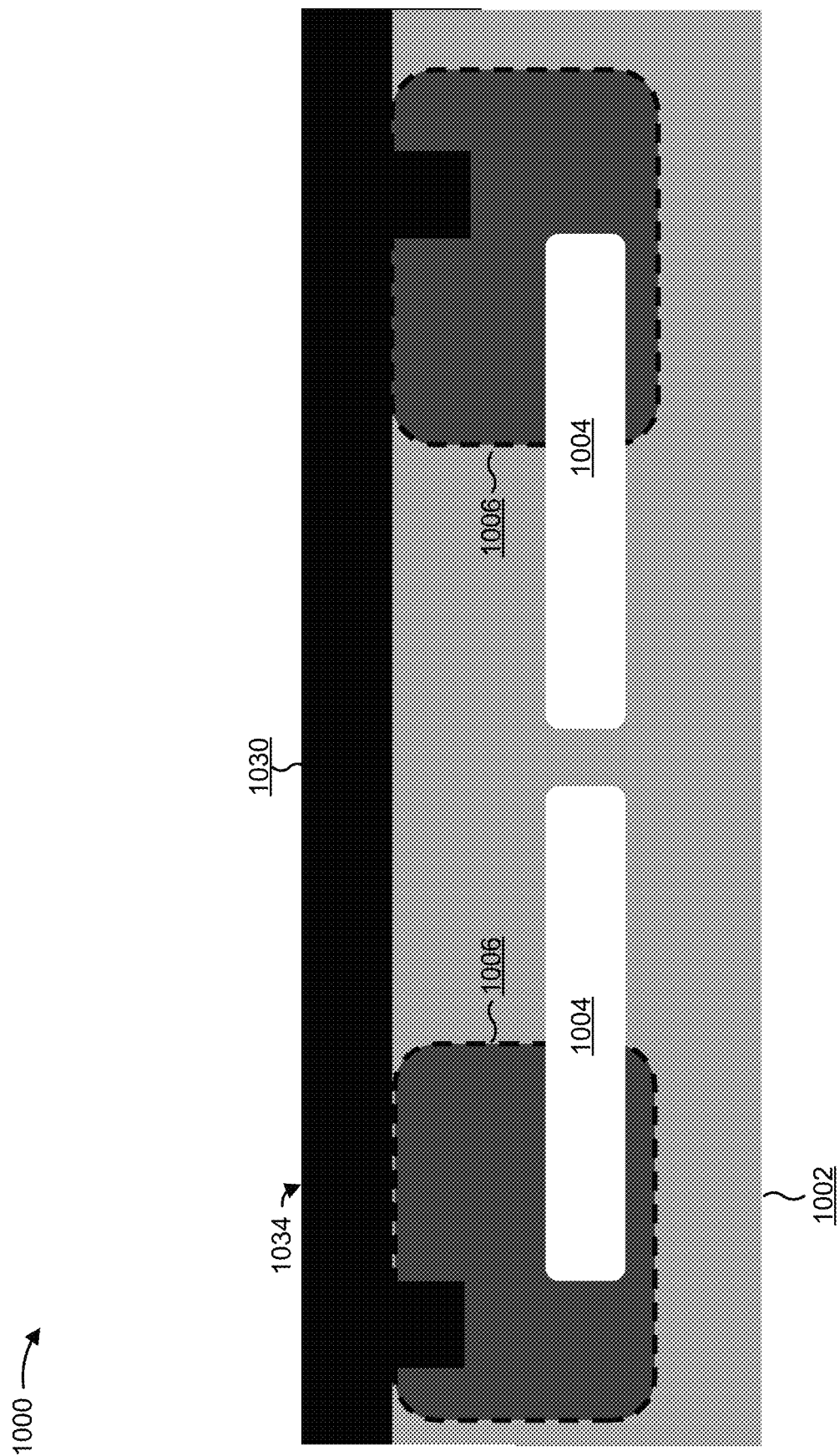
Figure 10E:
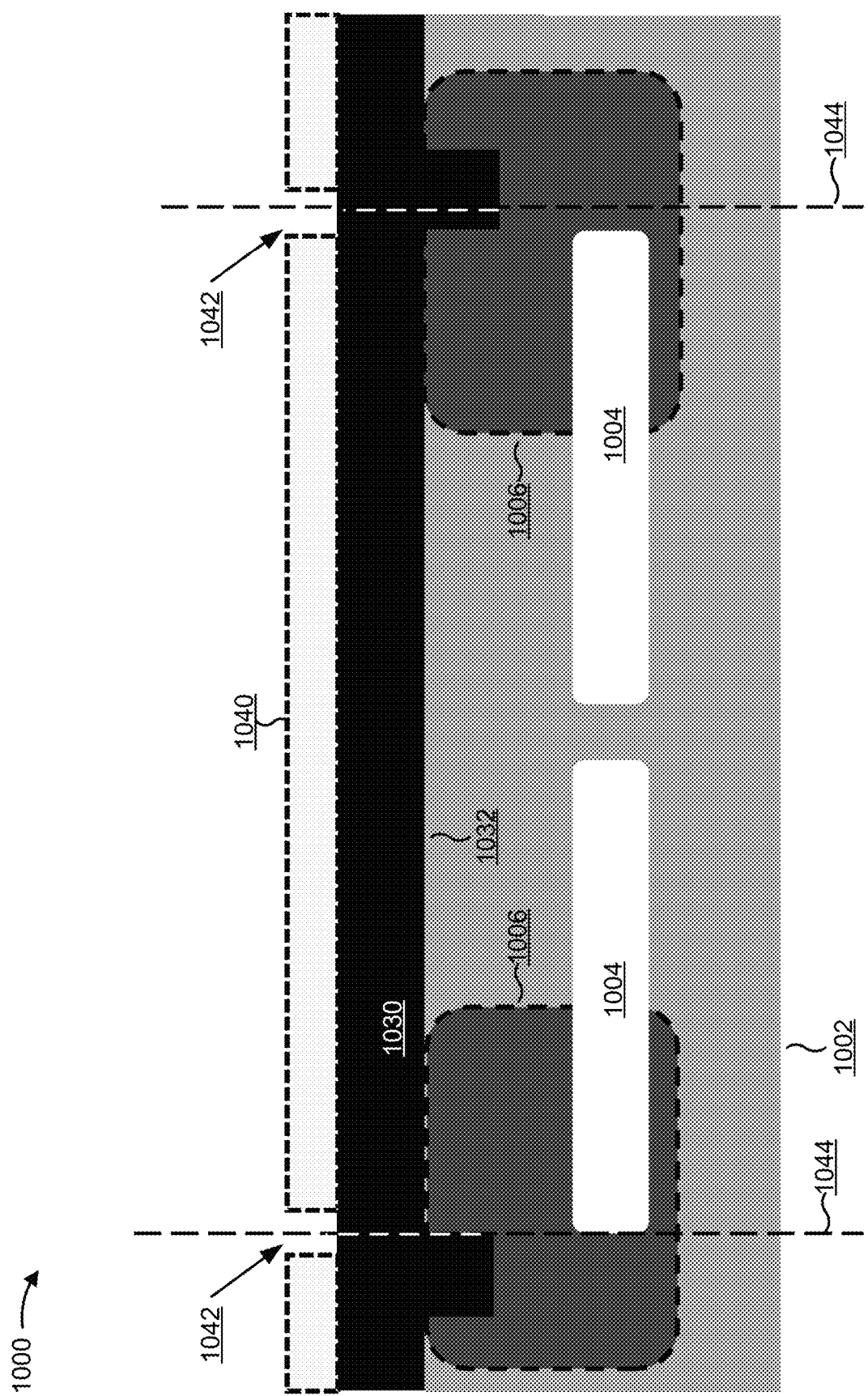

In FIG. 10C, a dielectric layer 1030 (e.g., an insulating layer, such as an oxide layer, a tetraethyl orthosilicate (TEOS) layer, etc.) is placed over the substrate 1002 to fill the insulated regions 1022 and cover a top surface 1032 of the substrate 1002. For example, a chemical vapor deposition (CVD) process, a plasma-CVD process, or the like may be used to place the dielectric layer 1030 over the substrate 1002. In FIG. 10D, the dielectric layer 1030 is shaped (e.g., via a chemical mechanical polishing (CMP)) such that a dielectric surface 1034 of the dielectric layer 1030 is parallel to the top surface 1032 of the substrate 1002. In FIG. 10E, an alignment mask 1040 with alignment openings 1042 may be placed over the dielectric layer 1030. The alignment openings 1042 in FIG. 10E create gap guides 1044 in order to align gaps in the substrate 1002 (e.g., similar to gap 512).

Figure 10F:
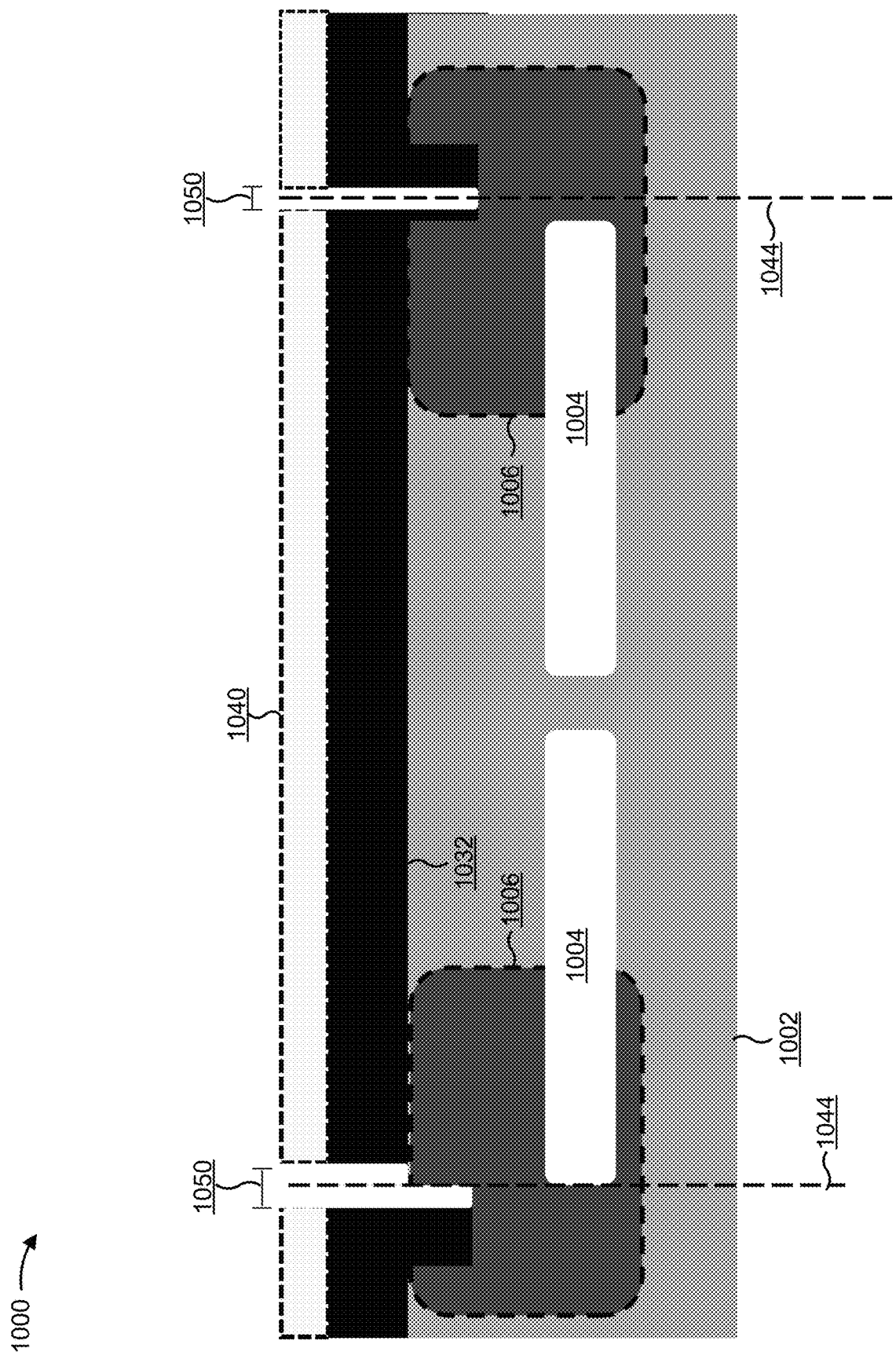
Figure 10G:
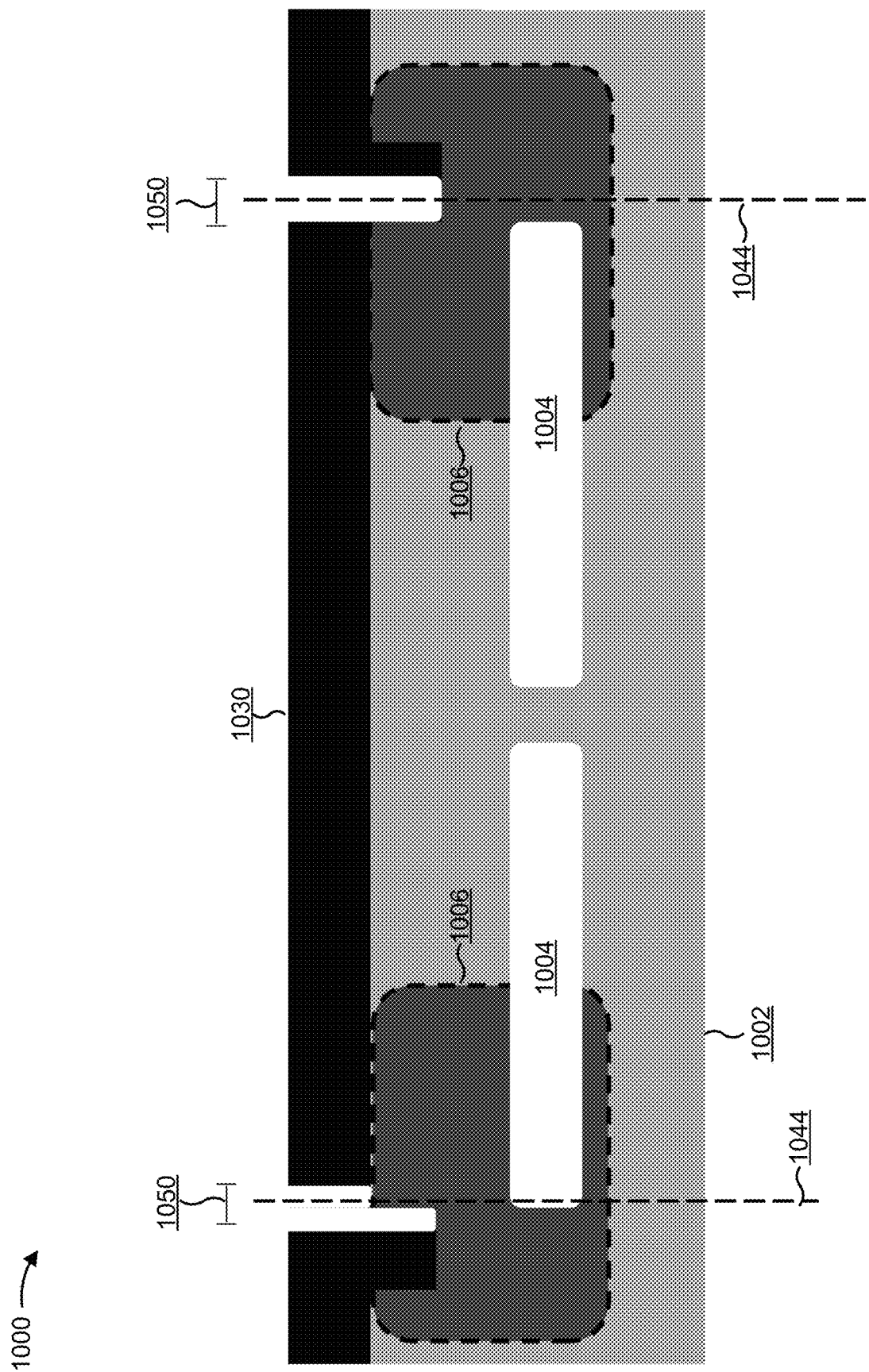
Figure 10H:
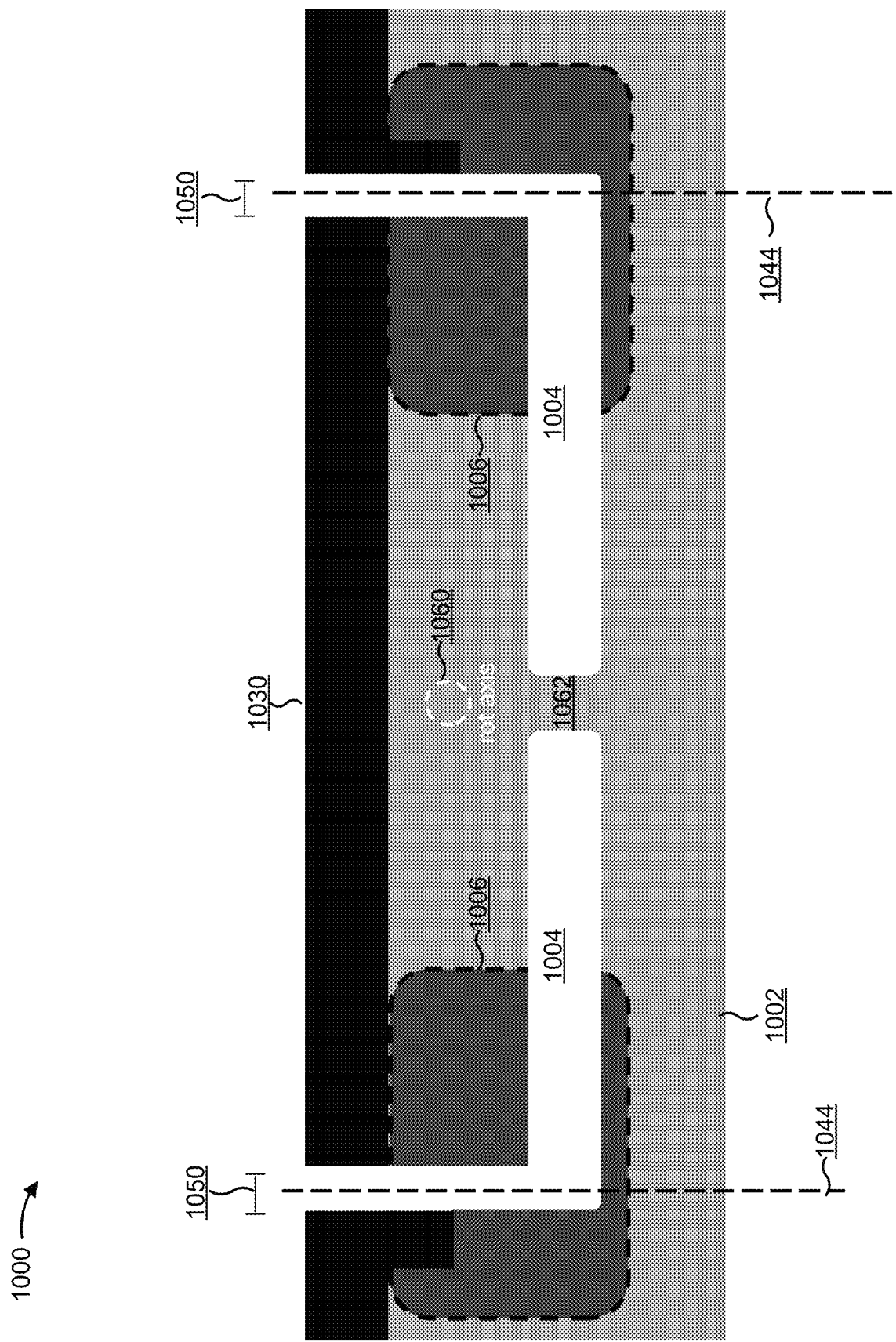
Figure 10I:
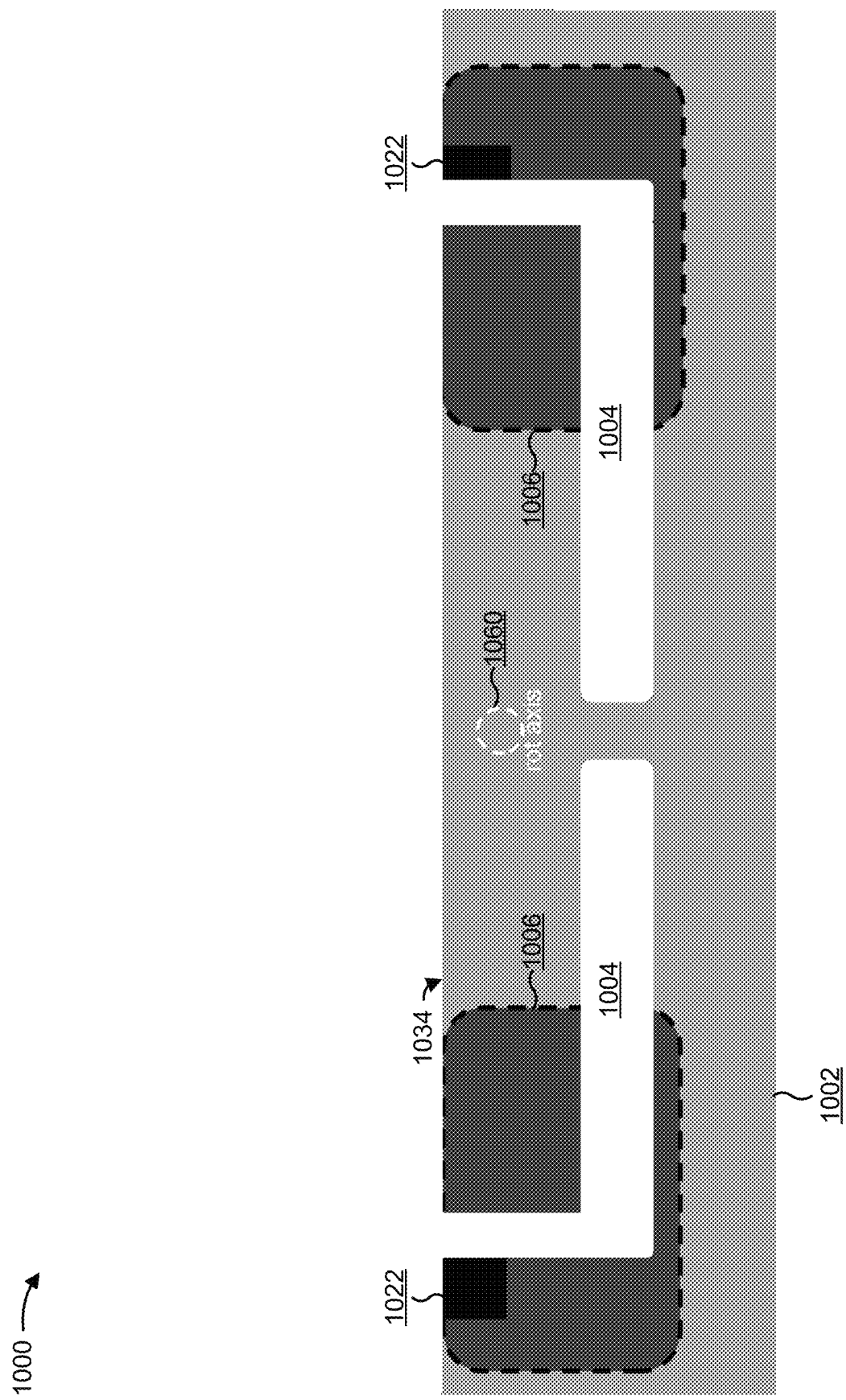

In FIG. 10F, gaps 1050 may be formed through the alignment mask 1040, the dielectric layer 1030, and into the insulated regions 1022. A trench forming or gap forming process (e.g., a silicon dioxide etch) may be used to form the gaps 1050. In FIG. 10G, the alignment mask 1040 of FIGS. 10E and 10F is removed. In FIG. 10H, the gaps 1050 are extended into the cavities from the insulated regions 1022 via an etching process, creating a rotational axis 1060 and supporting spring 1062 in the substrate 1002. In FIG. 10I, the dielectric layer 1030 material that is above the top surface 1032 of the substrate 1002 is removed. Accordingly, a portion of the dielectric layer 1030 may remain as insulating material in the insulated regions 1022.

Accordingly, FIGS. 10A-10I includes an example process to form a MEMS device with an offset in an interdigitated capacitor according to some implementations herein.

Figure 11:
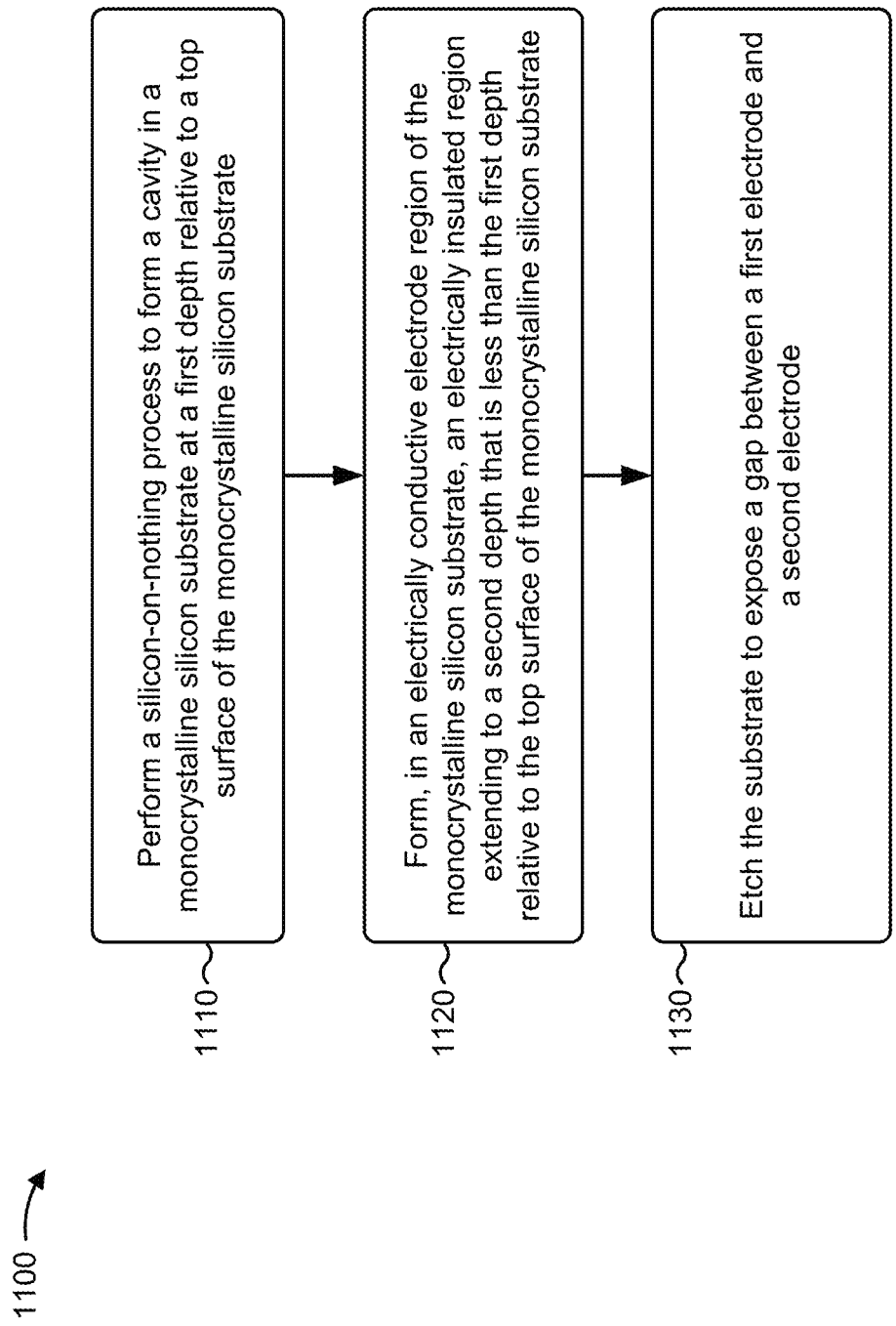
FIGS. 11 and 12 are flow charts of example processes for forming a MEMS device with an offset in an interdigitated capacitor.

FIG. 11 is a flow chart of an example process 1100 for forming a MEMS device with an offset in an interdigitated capacitor. In some implementations, process 1100 may be used to form MEMS device 120, MEMS device 200, MEMS device 400, MEMS device 500, MEMS device 600, MEMS device 700, MEMS device 800, MEMS device 900, MEMS device 1000, and/or the like.

As shown in FIG. 11, process 1100 may include performing a silicon-on-nothing process to form a cavity in a monocrystalline silicon substrate at a first depth relative to a top surface of the monocrystalline silicon substrate (block 1110). For example, during MEMS device formation, a silicon-on-nothing process may be performed to create one or more cavities in a monocrystalline silicon substrate, as described above in connection with FIGS. 5A, 5B, 6, 7, and 10A-10I. In some implementations, the monocrystalline silicon substrate is a non-silicon-on-insulator (non-SOI) substrate and/or wafer. In some implementations, at least one cavity, of the one or more cavities, is substantially tubular or substantially flat.

As further shown in FIG. 11, process 1100 may include forming, in an electrically conductive electrode region of the monocrystalline silicon substrate, an electrically insulated region extending to a second depth that is less than the first depth relative to the top surface of the monocrystalline substrate (block 1120). For example, the electrically insulated region may be a trench formed by performing a shallow trench isolation process, in which an edge of the trench is approximately aligned with an edge of the cavity, as described above.

As further shown in FIG. 11, process 1100 may include etching the substrate to expose a gap between a first electrode and a second electrode (block 1130). In some implementations, the substrate may be etched, using an etching technique, to expose a gap between the first electrode and the second electrode, as described above. In some implementations, the second electrode is separated from the first electrode, within a first depth region, by a first distance defined by the electrically insulated region and the gap. In some implementations, the second electrode is separated from the first electrode, within a second depth region, by a second distance defined by the gap. In some implementations, the first distance is greater than the second distance.

In some implementations, the first electrode and the second electrode may form part of an interdigitated capacitive electrode structure. In some implementations, a readout based on the first electrode and the second electrode exhibits a linear relationship between capacitance and an offset of the first electrode and the second electrode due to deflection or rotation. In some implementations, the second electrode may be formed on a pillar that extends from a base of the cavity.

Although FIG. 11 shows example blocks of process 1100, in some implementations, process 1100 may include additional blocks, fewer blocks, different blocks, or differently arranged blocks than those depicted in FIG. 11. Additionally, or alternatively, two or more of the blocks of process 1100 may be performed in parallel.

Figure 12:
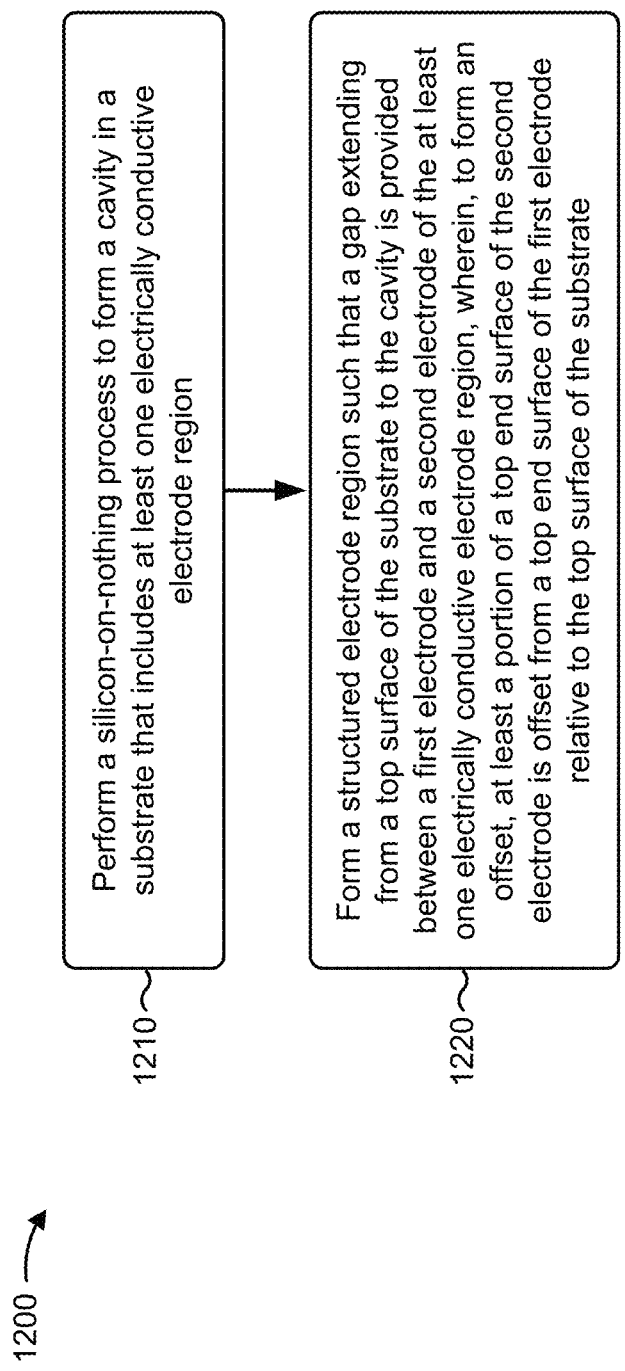

FIG. 12 is a flow chart of an example process 1200 for forming an interdigitated capacitive electrode structure. In some implementations, process 1200 may be used to form an interdigitated capacitive electrode structure of MEMS device 120, MEMS device 200, MEMS device 400, MEMS device 500, MEMS device 600, MEMS device 700, MEMS device 800, MEMS device 900, MEMS device 1000, and/or the like.

As shown in FIG. 12, process 1200 may include performing a silicon-on-nothing process to form a cavity in a substrate that includes at least one electrically conductive electrode region (block 1210). For example, the cavity may be formed at a first depth relative to a top surface of the substrate, as described above.

As further shown in FIG. 12, process 1200 may include forming a structured electrode region such that a gap extending from a top surface of the substrate to the cavity is provided between a first electrode and a second electrode of the at least one electrically conductive electrode region, wherein, to form an offset, at least a portion of a top end surface of the second electrode is offset from a top end surface of the first electrode relative to the top surface of the substrate (block 1220). In some implementations, an end surface of the first electrode and an end surface of the second electrode may face one another. Additionally, or alternatively, the offset may be formed by forming, in the at least one electrically conductive electrode region, an electrically insulated region extending to a second depth that is less than the first depth relative to the top surface of the substrate. In some implementations, the end surface of the first electrode is positioned closer than the cavity to the top surface of the substrate and the end surface of the second electrode is positioned farther than the electrically insulated region from the top surface of the substrate.

Although FIG. 12 shows example blocks of process 1200, in some implementations, process 1200 may include additional blocks, fewer blocks, different blocks, or differently arranged blocks than those depicted in FIG. 12. Additionally, or alternatively, two or more of the blocks of process 1200 may be performed in parallel.

Some techniques described herein may be used to form an electrically insulated region within an electrically conductive electrode region of a MEMS device, resulting in an offset between a first electrode and a second electrode of the electrode region. As such, improved uniform stress across the MEMS device and less sensor drift over time may be achieved, thereby improving sensor accuracy of the MEMS device.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, and/or a combination of hardware and software.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A microelectromechanical systems (MEMS) device, comprising:
   a non-silicon-on-insulator (SOI) monocrystalline semiconductor substrate comprising a MEMS structure that includes:
   a first electrode and a second electrode arranged to be movable relative to each other and separated by a gap, and
   an electrically insulated region formed between the first electrode and the second electrode and comprising a solid material,
   wherein the first electrode and the second electrode are part of an interdigitated electrode structure and are, within a first depth region, separated from each other by a first lateral distance and, within a second depth region, separated from each other by a second lateral distance,
   wherein the first lateral distance includes a first length associated with the gap and a second length associated with the electrically insulated region,
   wherein the second lateral distance includes the first length and not the second length, and
   wherein an edge of the second electrode is aligned with a first edge of the electrically insulated region,
   the first edge of the electrically insulated region being closer to the first electrode than a second edge of the electrically insulated region.

2. The MEMS device of claim 1, wherein the first depth region is located closer to a top surface of the non-SOI monocrystalline semiconductor substrate than the second depth region.

3. The MEMS device of claim 1, wherein the gap extends from a top surface of the non-SOI monocrystalline semiconductor substrate to a cavity formed in the non-SOI monocrystalline semiconductor substrate.

4. The MEMS device of claim 3, wherein the cavity is located farther from the top surface than the first depth region and the second depth region.

5. The MEMS device of claim 3, wherein an edge of the cavity is aligned with the first edge of the electrically insulated region.

6. The MEMS device of claim 1, wherein the first edge of the electrically insulated region is parallel to the second edge of the electrically insulated region.

7. The MEMS device of claim 1, wherein the MEMS structure further includes:
   a third electrode and a fourth electrode arranged to be movable relative to each other and separated by another gap.

8. A method of forming a microelectromechanical systems (MEMS) device, comprising:
   forming, in an electrically conductive electrode region of a non-silicon-on-insulator (SOI) monocrystalline semiconductor substrate, an electrically insulated region extending to a first depth relative to a top surface of the non-SOI monocrystalline semiconductor substrate, the electrically insulated region comprising a solid material; and
   etching the electrically conductive electrode region to expose a gap between a first electrode and a second electrode,
   the first electrode and the second electrode being movable relative to each other,
   the first electrode and the second electrode being part of an interdigitated electrode structure and being, within a first depth region, separated from each other by a first lateral distance and, within a second depth region, separated from each other by a second lateral distance, the first lateral distance including a first length associated with the gap and a second length associated with the electrically insulated region,
the second lateral distance including the first length and not the second length, and
an edge of the second electrode being aligned with a first edge of the electrically insulated region,
the first edge of the electrically insulated region being closer to the first electrode than a second edge of the electrically insulated region.

9. The method of claim 8, wherein the first depth region is located closer to the top surface of the non-SOI monocrystalline semiconductor substrate than the second depth region.

10. The method of claim 8, further comprising:
performing a silicon-on-nothing process to form a cavity in the non-SOI monocrystalline semiconductor substrate at a second depth relative to the top surface of the non-SOI monocrystalline semiconductor substrate.

11. The method of claim 10, wherein the cavity is located farther from the top surface than the first depth region and the second depth region.

12. The method of claim 10, wherein an edge of the cavity is approximately aligned with the first edge of the electrically insulated region.

13. The method of claim 8, further comprising:
forming, in another electrically conductive electrode region of the non-SOI monocrystalline semiconductor substrate, another electrically insulated region extending to the first depth relative to the top surface of the non-SOI monocrystalline semiconductor substrate;
and etching the other electrically conductive electrode region to expose another gap between a third electrode and a fourth electrode.

14. The method of claim 13, wherein an edge of the fourth electrode is aligned with an edge of the other electrically insulated region.

15. A microelectromechanical systems (MEMS) device, comprising:
a substrate including an electrically conductive electrode region,
the electrically conductive electrode region comprising:
a first electrode,
a second electrode,
a gap, and
an electrically insulated region comprising a solid material,
the first electrode, within a first depth region, being separated from the second electrode by the electrically insulated region and the gap,
the gap, within the first depth region, separating the electrically insulated region and the first electrode, and
the first electrode, within a second depth region, being separated from the second electrode by the gap.

16. The MEMS device of claim 15, wherein the first depth region is located closer to a top surface of the substrate than the second depth region.

17. The MEMS device of claim 15, wherein the gap extends from a top surface of the substrate to a cavity formed in the substrate.

18. The MEMS device of claim 17, wherein the cavity is located farther from the top surface than the first depth region and the second depth region.

19. The MEMS device of claim 17, wherein an edge of the cavity is aligned with an edge of the electrically insulated region.

20. The MEMS device of claim 17, wherein an edge of the cavity is aligned with an edge of a portion of the second electrode.

* * * * *